(12) United States Patent
Oh et al.

(10) Patent No.: US 11,869,425 B2
(45) Date of Patent: Jan. 9, 2024

(54) DISPLAY DEVICE

(71) Applicant: Samsung Display Co., LTD., Yongin-si (KR)

(72) Inventors: Won Sik Oh, Yongin-si (KR); Hyun Min Cho, Yongin-si (KR); Sin Chul Kang, Yongin-si (KR); Dae Hyun Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 117 days.

(21) Appl. No.: 17/434,271

(22) PCT Filed: Dec. 30, 2019

(86) PCT No.: PCT/KR2019/018712
§ 371 (c)(1),
(2) Date: Aug. 26, 2021

(87) PCT Pub. No.: WO2020/175783
PCT Pub. Date: Sep. 3, 2020

(65) Prior Publication Data
US 2022/0139319 A1 May 5, 2022

(30) Foreign Application Priority Data
Feb. 28, 2019 (KR) .................... 10-2019-0024263

(51) Int. Cl.
*G09G 3/3233* (2016.01)
*H01L 25/16* (2023.01)
(Continued)

(52) U.S. Cl.
CPC ......... *G09G 3/3233* (2013.01); *H01L 25/167* (2013.01); *H01L 27/124* (2013.01);
(Continued)

(58) Field of Classification Search
CPC .............. G09G 3/3225; G09G 3/3233; G09G 2300/0443; G09G 2300/0814;
(Continued)

(56) References Cited

U.S. PATENT DOCUMENTS 7,777,701 B2 * 8/2010 Eom .................... G09G 3/3233
345/82
8,076,674 B2 * 12/2011 Kwak .................. G09G 3/3233
257/E33.001
(Continued)

FOREIGN PATENT DOCUMENTS

| CN | 103000131 | 3/2013 |
| JP | 2010-19963 | 1/2010 |

(Continued)

OTHER PUBLICATIONS

"LED Design Forum: Avoiding thermal runaway when driving multiple LED strings (Magazine)", LEDs Magazine, Apr. 20, 2009, https://www.ledsmagazine.com/articles/print/volume-6/issue-2/features/led-design-forum-avoiding-thermal-runaway-when-driving-multiple-led-strings-magazine.html.
(Continued)

*Primary Examiner* — Vinh T Lam
(74) *Attorney, Agent, or Firm* — KILE PARK REED & HOUTTEMAN PLLC

(57) ABSTRACT

A display device may include a first power line; a second power line; a data line that transmits a data signal; a scan line that transmits a scan signal; and pixels electrically connected to the first power line, the second power line, the data line, and the scan line. Each of the pixels may include light emitting elements electrically connected between the first power line and the second power line; and a first transistor that provides driving current to the light emitting elements in response to the data signal.

19 Claims, 22 Drawing Sheets

(51) Int. Cl.
*H01L 27/12* (2006.01)
*H01L 33/62* (2010.01)

(52) U.S. Cl.
CPC ..... *H01L 33/62* (2013.01); *G09G 2300/0426* (2013.01); *G09G 2300/0452* (2013.01); *G09G 2300/0819* (2013.01); *G09G 2300/0842* (2013.01); *G09G 2320/0233* (2013.01)

(58) Field of Classification Search
CPC ... G09G 2300/0426; G09G 2300/0452; G09G 2300/0465; G09G 2300/0861; G09G 2300/0842; G09G 2300/0819; G09G 2320/0233; H01L 27/124; H01L 25/0753; H01L 25/167; H01L 33/62; H01L 33/44; H01L 33/20
See application file for complete search history.

(56) References Cited

U.S. PATENT DOCUMENTS

| | | | | |
|---|---|---|---|---|
| 8,111,224 | B2* | 2/2012 | Park | G09G 3/3233 345/83 |
| 8,872,214 | B2 | 10/2014 | Negishi et al. | |
| 9,112,112 | B2 | 8/2015 | Do et al. | |
| 9,460,691 | B2 | 10/2016 | Kim | |
| 9,773,761 | B2 | 9/2017 | Do | |
| 10,388,214 | B2 | 8/2019 | Na | |
| 10,424,250 | B2* | 9/2019 | Wang | H10K 50/81 |
| 10,461,123 | B2 | 10/2019 | Kim et al. | |
| 10,977,990 | B2* | 4/2021 | Jang | G09G 3/3275 |
| 11,217,161 | B2* | 1/2022 | Yin | G09G 3/3266 |
| 11,361,710 | B2* | 6/2022 | Yin | G09G 3/3266 |
| 11,367,394 | B2* | 6/2022 | Yamanaka | G09G 3/3233 |
| 11,403,997 | B2* | 8/2022 | Kwag | G09G 3/32 |
| 2011/0089850 | A1 | 4/2011 | Shibata et al. | |
| 2011/0109612 | A1 | 5/2011 | Chaji et al. | |
| 2016/0012799 | A1 | 1/2016 | Kim | |
| 2016/0155379 | A1* | 6/2016 | Na | G09G 3/3233 345/215 |
| 2017/0076646 | A1 | 3/2017 | Gu et al. | |
| 2017/0200412 | A1 | 7/2017 | Gu et al. | |
| 2018/0033830 | A1* | 2/2018 | Kim | H10K 59/123 |
| 2018/0175009 | A1* | 6/2018 | Kim | H01L 25/167 |
| 2018/0198018 | A1* | 7/2018 | Kim | H01L 33/0095 |
| 2019/0073963 | A1* | 3/2019 | Yang | G09G 3/3291 |
| 2019/0172761 | A1* | 6/2019 | Guo | H01L 22/22 |
| 2020/0013766 | A1* | 1/2020 | Kim | H01L 25/167 |
| 2021/0217739 | A1* | 7/2021 | Lee | H01L 33/50 |
| 2021/0305225 | A1* | 9/2021 | Kim | H01L 25/167 |
| 2021/0320231 | A1* | 10/2021 | Kim | H01L 25/167 |
| 2021/0335168 | A1* | 10/2021 | Lee | G09G 3/006 |
| 2021/0335230 | A1* | 10/2021 | Ma | G09G 3/3233 |
| 2021/0358408 | A1* | 11/2021 | Zhang | G09G 3/3233 |
| 2021/0390902 | A1* | 12/2021 | Lee | G09G 3/2007 |
| 2022/0139319 | A1* | 5/2022 | Oh | G09G 3/3225 345/204 |
| 2023/0005987 | A1* | 1/2023 | Kang | H01L 33/62 |
| 2023/0013528 | A1* | 1/2023 | Jang | G09G 3/2096 |
| 2023/0049527 | A1* | 2/2023 | Lee | G09G 3/2007 |

FOREIGN PATENT DOCUMENTS

| | | |
|---|---|---|
| KR | 10-1244926 | 3/2013 |
| KR | 10-1490758 | 2/2015 |
| KR | 10-2016-0007900 | 1/2016 |
| KR | 10-2016-0066595 | 6/2016 |
| KR | 10-2017-0050371 | 5/2017 |
| KR | 10-2018-0072909 | 7/2018 |
| WO | WO-2020230989 A1 * 11/2020 ......... H01L 25/0753 |

OTHER PUBLICATIONS

Muhinthan Murugesu, "Current distribution in parallel LED strings", Articles: Vector, Oct. 14, 2015, EE publishers, http://www.ee.co.za/article/current-distribution-parallel-led-strings.html.
International Search Report, with English translation, corresponding to International Application No. PCT/KR2019/018712 dated Apr. 8, 2020.
Written Opinion, with English translation, corresponding to International Application No. PCT/KR2019/018712, dated Apr. 8, 2020.
Extended European search report for European Patent Application or Patent No. 19916942.6, dated Sep. 30, 2022.

* cited by examiner

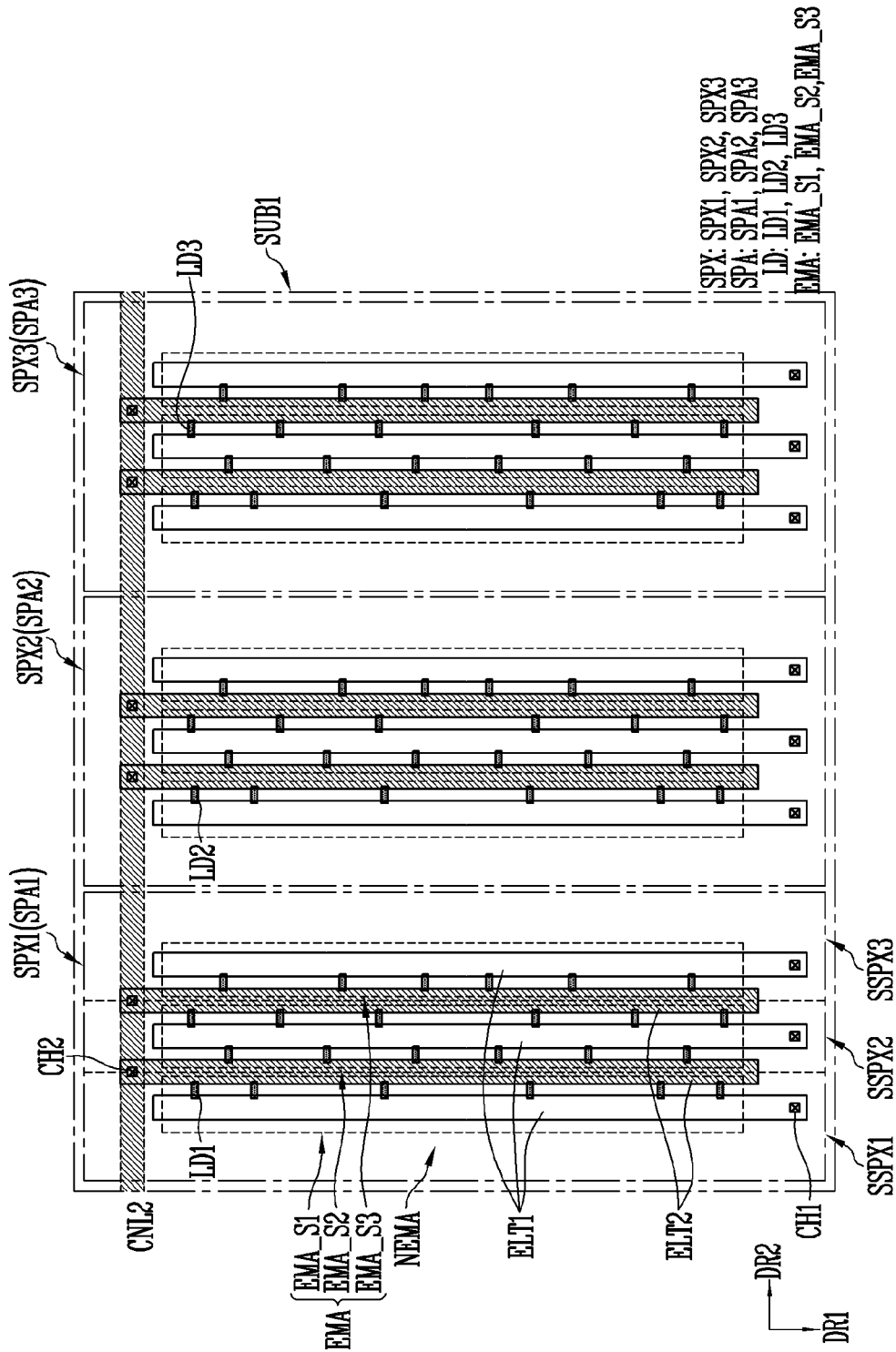

DISPLAY DEVICE

CROSS-REFERENCE TO RELATED APPLICATION(S)

This application is a national entry of International Application No. PCT/KR2019/018712, filed on Dec. 30, 2019, which claims under 35 U.S.C. §§ 119(a) and 365(b) priority to and benefits of Korean Patent Application No. 10-2019-0024263, filed on Feb. 28, 2019, in the Korean Intellectual Property Office (KIPO), the entire contents of which are incorporated herein by reference.

BACKGROUND

1. Technical Field

Various embodiments of the disclosure relate to a display device.

2. Description of Related Art

Recently, a technique of manufacturing a subminiature light emitting element using a material having a reliable inorganic crystal structure and manufacturing a light emitting device using the light emitting element has been developed. For example, a technique of configuring a light source of a light emitting device using subminiature light emitting elements having a small size corresponding to a range from a nanoscale size to a microscale size has been developed. Such a light emitting device may be used in various electronic devices such as a display device and a lighting device.

Each pixel which forms a display device may include a driving transistor and subminiature light emitting elements electrically connected to the driving transistor. Although it is desired that driving current provided from the driving transistor is evenly distributed to the light emitting elements so that the light emitting elements uniformly emit light, the driving current may be focused on a specific light emitting element (e.g., a light emitting element having a lowest forward voltage drop (Vf)) because of a characteristic deviation (e.g., a Vf deviation attributable to a light emitting element) of the light emitting elements, whereby only the specific light emitting element may emit light.

An object of the disclosure is to provide a display device in which light emitting elements in each pixel may uniformly emit light.

SUMMARY

According to an aspect of the disclosure, a display device in accordance with an embodiment of the disclosure may include a first power line; a second power line; a data line that transmits a data signal; a scan line that transmits a scan signal; and a plurality of pixels electrically connected to the first power line, the second power line, the data line, and the scan line. Each of the plurality of pixels may include light emitting elements electrically connected between the first power line and the second power line; and a first transistor that provides driving current to the light emitting elements in response to the data signal.

In an embodiment, each of the light emitting elements may include a rod-shaped light emitting diode having a size in a range of a nanometer scale to a micrometer scale.

In an embodiment, the plurality of pixels may be disposed in a pixel area defined by the data line, an adjacent data line adjacent to the data line, the scan line, and an adjacent scan line adjacent to the scan line.

In an embodiment, each of the plurality of pixels may include a second transistor electrically connected between the data line and the first transistor, and transmit the data signal to the first transistor in response to the scan signal.

In an embodiment, each of the plurality of pixels may include a capacitor electrically connected between a gate electrode of the first transistor and the first power line.

In an embodiment, the display device may further include a common circuit electrically connected between the data line and the plurality of pixels. The common circuit may include a second transistor that transmits the data signal to the first transistor of each of the plurality of pixels in response to the scan signal.

In an embodiment, the display device may further include a third power line. The common circuit may include a capacitor electrically connected between a gate electrode of the first transistor of each of the plurality of pixels and the first power line; and a third transistor electrically connected to the third power line and an electrode of the capacitor.

In an embodiment, each of the plurality of pixels may include a fourth transistor electrically connected between anode electrodes of the light emitting elements and the third power line.

In an embodiment, each of the plurality of pixels may include a capacitor electrically connected to a gate electrode of the first transistor and an electrode of the first transistor.

In an embodiment, the display device may further include a third power line. Each of the plurality of pixels may include a capacitor coupled between a gate electrode of the first transistor of each of the plurality of pixels and the first power line; a third transistor electrically connected to the third power line and one electrode of the capacitor; and a fourth transistor electrically connected between anode electrodes of the light emitting elements and the third power line.

In an embodiment, the display device may further include a sensing line. Each of the plurality of pixels may include a fifth transistor electrically connected between anode electrodes of the light emitting elements and the sensing line.

In an embodiment, at least some of the light emitting elements included in each of the plurality of pixels may be electrically connected in series between the first power line and the second power line.

According to an aspect of the disclosure, a display device in accordance with an embodiment of the disclosure may include a first power line; a second power line; a data line that transmits a data signal; a scan line that transmits a scan signal; and a pixel electrically connected to the first power line, the second power line, the data line, and the scan line. The pixel may include a plurality of light source units electrically connected between the first power line and the second power line, each of the plurality of light source units comprising a plurality of light emitting elements; and a plurality of pixel circuits that independently provide, to each of the plurality of light source units, driving current corresponding to the data signal provided in response to the scan signal.

In an embodiment, each of the plurality of pixel circuits may include a first transistor that provides driving current to the plurality of light emitting elements in response to the data signal.

In an embodiment, the pixel may further include a common circuit electrically connected to the data line, the scan line, and the plurality of pixel circuits. The common circuit may include a second transistor that transmits the data signal to the first transistor of each of the plurality of pixel circuits in response to the scan signal.

According to an aspect of the disclosure, a display device in accordance with an embodiment of the disclosure may include a substrate including an emission area; a first electrode disposed on the emission area of the substrate; second electrodes disposed on the emission area of the substrate, facing the first electrode, and spaced apart from each other and electrically disconnected from each other; first light emitting elements disposed between a first sub-electrode of the second electrodes and the first electrode; and second light emitting elements disposed between a second sub-electrode of the second electrodes and the first electrode.

In an embodiment, the display device may further include a bank disposed on the substrate along a perimeter of the emission area. The bank may not be disposed between the second electrodes in the emission area.

In an embodiment, the first electrode may extend in a first direction. The second electrodes may extend in the first direction and be spaced apart from each other in the first direction.

In an embodiment, the first electrode may extend in a first direction. The second electrodes may extend in the first direction and be spaced apart from each other in a second direction perpendicular to the first direction.

In an embodiment, the display device may further include a third electrode disposed between the first sub-electrode and the first electrode, and spaced apart from the first sub-electrode and the first electrode. The first light emitting elements each may be disposed between two adjacent electrodes among the first sub-electrode, the first electrode, and the third electrode.

In a display device in accordance with an embodiment of the disclosure, light emitting elements distributed to sub-emission areas which form each pixel may be independently driven by sub-emission areas, so that the light emitting elements in each pixel can uniformly emit light.

BRIEF DESCRIPTION OF THE DRAWINGS

An additional appreciation according to the embodiments of the disclosure will become more apparent by describing in detail the embodiments thereof with reference to the accompanying drawings, wherein:

FIGS. 10A and 10B are plan views schematically illustrating other examples of a sub-pixel included in the display device of FIG. 4.

DETAILED DESCRIPTION OF THE EMBODIMENTS

Figure 1A:
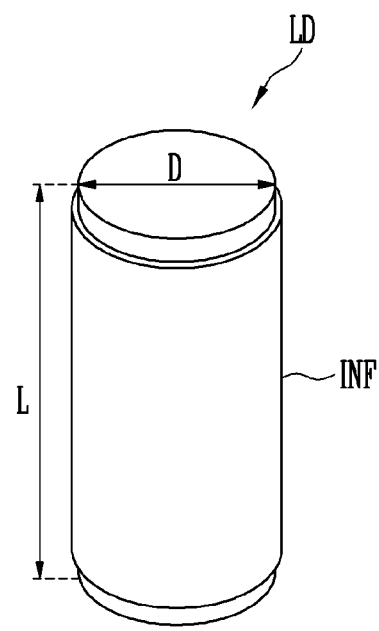
FIGS. 1A and 1B are respectively a perspective view and a cross-sectional view schematically illustrating a light emitting element in accordance with an embodiment of the disclosure.

Reference will now be made in detail to various embodiments of the disclosure, specific examples of which are illustrated in the accompanying drawings and described below, since the embodiments of the disclosure can be variously modified in many different forms. However, the disclosure is not limited to the following embodiments and may be modified into various forms.

Some elements which are not directly related to the features of the disclosure in the drawings may be omitted to clearly explain the disclosure. Furthermore, the sizes, ratios, etc. of some elements in the drawings may be exaggerated. It should be noted that the same reference numerals are used to designate the same or similar elements throughout the drawings, and repetitive explanation will be omitted.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Figure 1B:
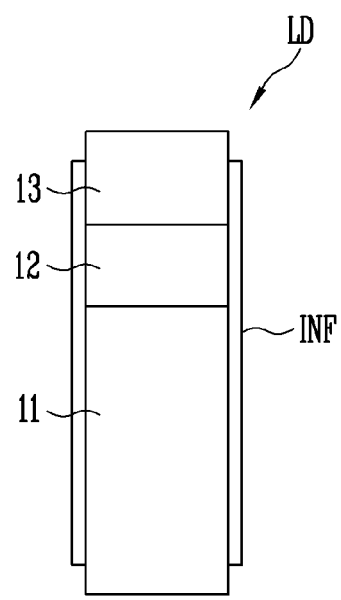

FIGS. 1A and 1B are respectively a perspective view and a cross-sectional view schematically illustrating a light emitting element in accordance with an embodiment. Although FIGS. 1A and 1B illustrate a rod-type light emitting element LD of a cylindrical shape, the type and/or shape of the light emitting element LD according to the disclosure are not limited thereto.

Referring to FIGS. 1A and 1B, the light emitting element LD may include a first conductive semiconductor layer (or first semiconductor layer) 11, a second conductive semiconductor layer 13, and an active layer 12 interposed between the first and second conductive semiconductor layers 11 and 13. For example, the light emitting element LD may be configured of (or formed of) a stacked body formed by successively stacking the first conductive semiconductor layer 11, the active layer 12, and the second conductive semiconductor layer 13 in a direction.

In an embodiment, the light emitting element LD may be provided in the form of a rod extending in a direction. The light emitting element LD may have a first end and a second end in a direction.

In an embodiment, one of the first and second conductive semiconductor layers 11 and 13 may be disposed on the first end of the light emitting element LD, and the other of the first and second conductive semiconductor layers 11 and 13 may be disposed on the second end of the light emitting element LD.

In an embodiment, the light emitting element LD may be a rod-type light emitting diode manufactured in the form of a rod. Here, the term "rod-like shape" embraces a rod-like shape and a bar-like shape such as a cylindrical shape and a prismatic shape that is longer in a longitudinal direction than in a width direction (for example, having an aspect ratio greater than one), and the cross-sectional shape thereof is not limited to a particular shape. For example, a length L of the light emitting element LD may be greater than a diameter D thereof (or a width of the cross-section thereof).

In an embodiment, the light emitting element LD may have a small size corresponding to the nanometer scale or the micrometer scale, e.g., a diameter D and/or a length L corresponding to the nanometer scale or the micrometer scale. However, the size of the light emitting element LD is not limited thereto. For example, the size of the light emitting element LD may be changed in various ways depending on design conditions of various devices, e.g., a display device, which employs, as a light source, a light emitting device using a light emitting element LD.

The first conductive semiconductor layer 11 may include at least one n-type semiconductor layer. For instance, the first conductive semiconductor layer 11 may include an n-type semiconductor layer which includes a semiconductor material of InAlGaN, GaN, AlGaN, InGaN, AlN, and InN and is doped with a first conductive dopant such as Si, Ge, or Sn. However, a material for forming the first conductive semiconductor layer 11 is not limited thereto, and the first conductive semiconductor layer 11 may be formed of various other materials.

The active layer 12 may be disposed on the first conductive semiconductor layer 11 and have a single or multiple quantum well structure. In an embodiment, a cladding layer (not shown) doped with a conductive dopant may be formed over and/or under the active layer 12. For example, the cladding layer may be formed of an AlGaN layer or an InAlGan layer. In an embodiment, a material such as AlGaN or AlInGaN may be used to form the active layer 12, and various other materials may be used to form the active layer 12.

If a voltage equal to or greater than a predetermined voltage is applied between the opposite ends of the light emitting element LD, the light emitting element LD may emit light by coupling of electron-hole pairs in the active layer 12. Since light emission of the light emitting element LD can be controlled based on the foregoing principle, the light emitting element LD may be used as a light source of various light emitting devices as well as a pixel of the display device.

The second conductive semiconductor layer 13 may be disposed on the active layer 12 and include a semiconductor layer having a type different from that of the first conductive semiconductor layer 11. For example, the second conductive semiconductor layer 13 may include at least one p-type semiconductor layer. For instance, the second conductive semiconductor layer 13 may include a p-type semiconductor layer which includes a semiconductor material of InAlGaN, GaN, AlGaN, InGaN, AlN, and InN, and is doped with a second conductive dopant such as Mg. However, a material for forming the second conductive semiconductor layer 13 is not limited thereto, and the second conductive semiconductor layer 13 may be formed of various other materials.

In an embodiment, the light emitting element LD may further include an insulating film INF provided on a surface of the light emitting element LD. The insulating film INF may be formed on the surface of the light emitting element LD to at least enclose an outer circumferential surface of at least the active layer 12 and may further enclose predetermined areas of the first and second conductive semiconductor layers 11 and 13. Here, the insulating film INF may allow the opposite ends of the light emitting element LD that have different polarities to be exposed to the outside. For example, the insulating film INF may expose an end of each of the first and second conductive semiconductor layers 11 and 13 that are disposed on the respective opposite ends of the light emitting element LD in the longitudinal direction, and, e.g., may expose two surfaces (for example, top and bottom surfaces) of the cylinder rather than covering (or overlapping) them.

In an embodiment, the insulating film INF may include at least one insulating material of silicon dioxide ($SiO_2$), silicon nitride ($Si_3N_4$), aluminum oxide ($Al_2O_3$), and titanium dioxide ($TiO_2$), but the disclosure is not limited thereto. In other words, a material that forms the insulating film INF is not limited to a particular material, and the insulating film INF may be formed of various insulating materials.

In an embodiment, the light emitting element LD may further include additional other components as well as the first conductive semiconductor layer 11, the active layer 12, the second conductive semiconductor layer 13, and/or the insulating film INF. For example, the light emitting element LD may further include one or more fluorescent layers, one or more active layers, one or more semiconductor layers, and/or one or more electrode layers disposed on ends of the first conductive semiconductor layer 11, the active layer 12, and/or the second conductive semiconductor layer 13.

Figure 2A:
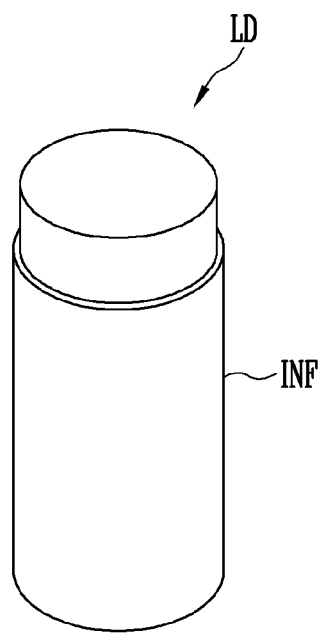
FIGS. 2A and 2B are respectively a perspective view and a cross-sectional view schematically illustrating a light emitting element in accordance with an embodiment of the disclosure.
Figure 2B:
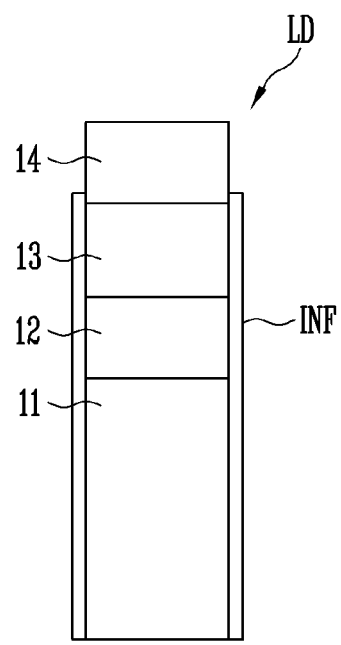
Figure 3A:
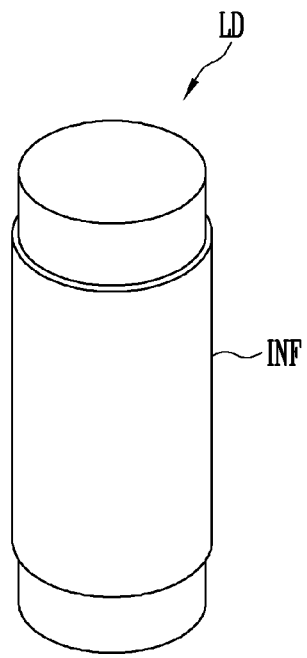
FIGS. 3A and 3B are respectively a perspective view and a cross-sectional view schematically illustrating a light emitting element in accordance with an embodiment of the disclosure.
Figure 3B:
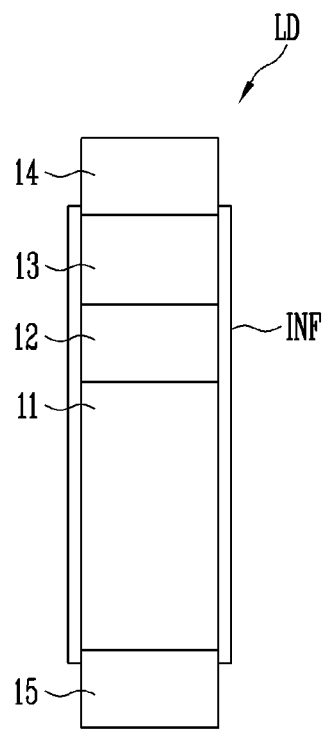

FIGS. 2A and 2B are respectively a perspective view and a cross-sectional view schematically illustrating a light emitting element in accordance with an embodiment. FIGS. 3A and 3B are respectively a perspective view and a cross-sectional view schematically illustrating a light emitting element in accordance with an embodiment.

Referring to FIGS. 2A and 2B, the light emitting element LD may further include at least one electrode layer 14 disposed on an end of the second conductive semiconductor layer 13.

Referring to FIGS. 3A and 3B, the light emitting element LD may further include at least one electrode layer 15 disposed on an end of the first conductive semiconductor layer 11.

Each of the electrode layers 14 and 15 may be an ohmic contact electrode, but the disclosure is not limited thereto. Furthermore, each of the electrode layers 14 and 15 may include metal or conductive metal oxide. For example, each of the electrode layers 14 and 15 may be formed of transparent electrode materials such as chromium (Cr), titanium (Ti), aluminum (Al), gold (Au), nickel (Ni), oxides or alloys thereof, indium tin oxide (ITO), indium zinc oxide (IZO), zinc oxide (ZnO), or indium tin zinc oxide (ITZO) alone or in combination. The electrode layers 14 and 15 may be substantially transparent or semitransparent. Therefore, light generated from the light emitting element LD may be emitted to the outside after passing through the electrode layers 14 and 15.

In an embodiment, the insulating film INF may at least partially enclose outer surfaces of the electrode layers 14 and 15, or may not enclose them. In other words, the insulating film INF may be selectively formed on surfaces of the electrode layers 14 and 15. Furthermore, the insulating film INF may be formed to expose the opposite ends of the light emitting element LD that have different polarities and, for example, may expose at least an area of each of the electrode layers 14 and 15. However, the disclosure is not limited thereto, and the insulating film INF may not be provided.

If the insulating film INF is provided on the surface of the light emitting element LD, for example, on a surface of the active layer 12, the active layer 12 may be prevented from short-circuiting with at least one electrode, e.g., at least one contact electrode of contact electrodes electrically connected to the opposite ends of the light emitting element LD, etc. Consequently, the electrical stability of the light emitting element LD may be ensured.

Furthermore, the insulating film INF may be formed on the surface of the light emitting element LD, thereby minimizing surface defects of the light emitting element LD and improving the lifespan and efficiency of the light emitting element LD. Moreover, the insulating film INF is formed on the surface of the light emitting element LD, thereby preventing an undesired short circuit between the light emitting elements LD from occurring even if multiple light emitting elements LD are arranged in close proximity to each other.

In an embodiment, the light emitting element LD may be manufactured by a surface treatment process (e.g., coating). For example, when the light emitting elements LD is mixed with fluid solution (or solvent) and supplied to each emission area (e.g., an emission area of each pixel), the light emitting elements LD may be uniformly dispersed without being non-uniformly aggregated in the solution. Here, the emission area is an area in which light is emitted by the light emitting elements LD. The emission area may be distinguished from a non-emission area in which light is not emitted.

In some embodiments, the insulating film INF itself may be formed of a hydrophobic film using hydrophobic material, or an additional hydrophobic film formed of hydrophobic material may be formed on the insulating film INF. In an embodiment, the hydrophobic material may be a material containing fluorine to exhibit hydrophobicity. In an embodiment, the hydrophobic material may be applied to the light emitting elements LD in the form of a self-assembled monolayer (SAM). In this case, the hydrophobic material may include octadecyl trichlorosilane, fluoroalkyl trichlorosilane, perfluoroalkyl triethoxysilane, etc. Furthermore, the hydrophobic material may be a commercially available fluorine containing material such as Teflon™ or Cytop™ or a corresponding material.

A light emitting device including the light emitting element LD described above may be used in various devices including a display device which requires a light source. For instance, at least one subminiature light emitting element LD, e.g., subminiature light emitting elements LD each having a size ranging from the nanometer scale to the micrometer scale, may be disposed in each pixel area of the display panel to form a light source (or a light source unit) of the corresponding pixel using the subminiature light emitting elements LD. Furthermore, the field of application of the light emitting element LD according to the disclosure is not limited to a display device. For example, the light emitting element LD may also be used in other types of devices such as a lighting device, which requires a light source.

Figure 4:
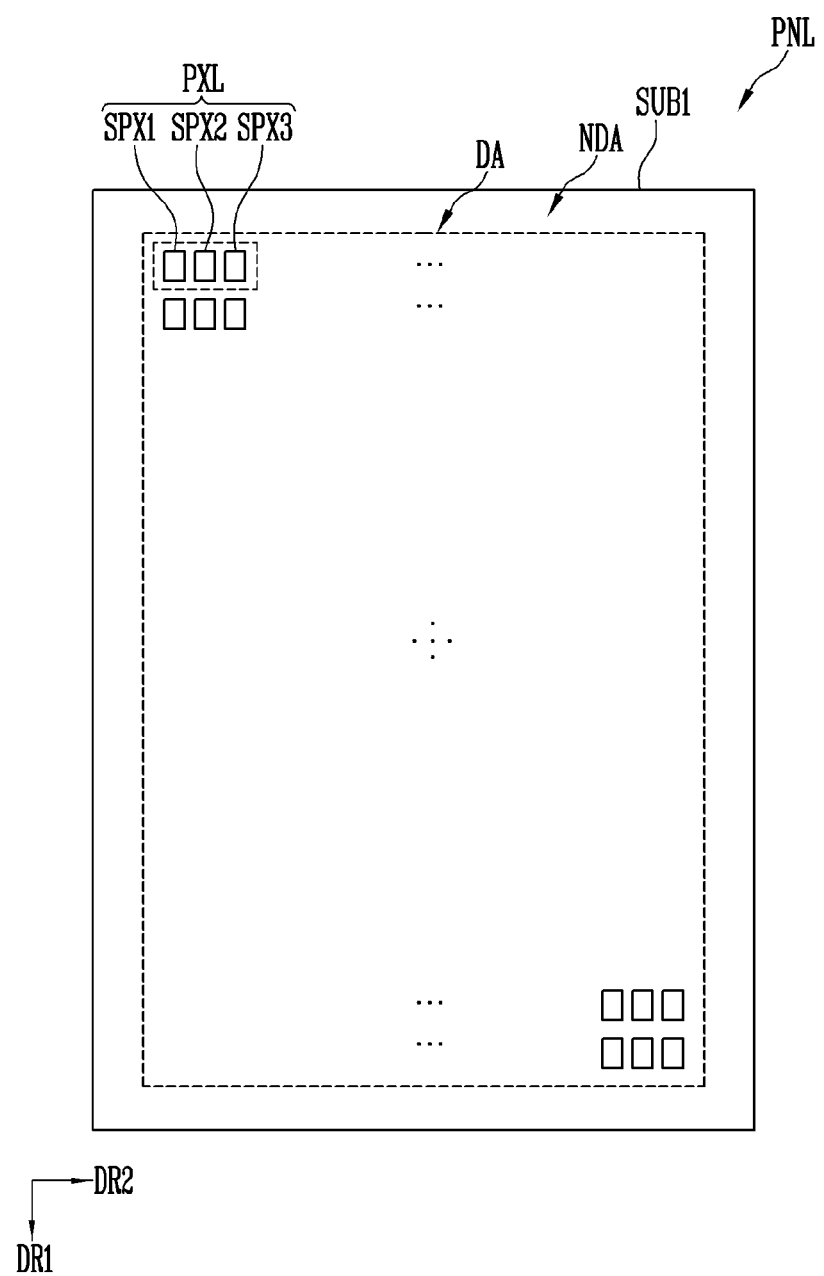
FIG. 4 is a plan view schematically illustrating a display device in accordance with an embodiment of the disclosure.

FIG. 4 is a plan view schematically illustrating a display device in accordance with an embodiment. In an embodiment, FIG. 4 illustrates a display device, particularly, a display panel PNL provided in the display device, as an example of a device which may use, as a light source, the light emitting elements LD described with reference to FIGS. 1A to 3B. In accordance with the embodiment, FIG. 4 schematically illustrates the structure of the display panel PNL, focusing on a display area DA. In some embodiments, although not illustrated, at least one driving circuit component (e.g., at least one of a scan driver and a data driver) and/or lines may be further provided on the display panel PNL.

Referring to FIG. 4, the display panel PNL may include a base layer SUB1 (or substrate) and a pixel PXL disposed on the base layer SUB1. In detail, the display panel PNL and the base layer SUB1 may include a display area DA configured to display an image, and a non-display area NDA formed in a predetermined area other than the display area DA.

In an embodiment, the display area DA may be disposed in a central area of the display panel PNL, and the non-display area NDA may be disposed along a border of the display panel PNL in such a way as to enclose the display area DA. The locations of the display area DA and the non-display area NDA are not limited thereto, and the locations thereof may be changed.

The base layer SUB1 may form a base of the display panel PNL. For example, the base layer SUB1 may form a base of a lower panel (e.g., a lower plate of the display panel PNL).

In an embodiment, the base layer SUB1 may be a rigid or flexible substrate, and the material or properties thereof are not particularly limited. For example, the base layer SUB1 may be a rigid substrate made of glass or reinforced (or tempered) glass, or a flexible substrate formed of a thin film made of plastic or metal. Furthermore, the base layer SUB1 may be a transparent substrate, but the disclosure is not limited thereto. For instance, the base layer SUB1 may be a translucent substrate, an opaque substrate, or a reflective substrate.

An area on the base layer SUB1 is defined as the display area DA in which the pixels PXL are disposed, and the other area thereof is defined as the non-display area NDA. For example, the base layer SUB1 may include the display area DA including pixel areas in which the pixels PXL are formed, and the non-display area NDA disposed around the display area DA. Various lines and/or internal circuits which are electrically connected to the pixels PXL of the display area DA may be disposed in the non-display area NDA.

The pixel PXL may include at least one light emitting element LD, e.g., at least one rod-type light emitting diode according to an embodiment shown in FIGS. 1A to 3B, which is driven by a corresponding scan signal and a corresponding data signal. For example, the pixel PXL may include rod-type light emitting diodes, each of which has a small size ranging from the nanometer scale to the micrometer scale, and which are electrically connected in parallel to each other. The rod-type light emitting diodes may form a light source of each pixel PXL.

Furthermore, the pixel PXL may include sub-pixels. For example, the pixel PXL may include a first sub-pixel SPX1, a second sub-pixel SPX2, and a third sub-pixel SPX3. In an embodiment, the first, second, and third sub-pixels SPX1, SPX2, and SPX3 may emit different colors of light. For instance, the first sub-pixel SPX1 may be a red sub-pixel for emitting red light, the second sub-pixel SPX2 may be a green sub-pixel for emitting green light, and the third sub-pixel SPX3 may be a blue sub-pixel for emitting blue light. However, the colors, types, and/or numbers of sub-pixels forming each pixel PXL are not particularly limited. For example, the color of light which is emitted from each sub-pixel may be changed in various ways. Although FIG. 4 illustrates an embodiment where the pixels PXL are arranged in the display area DA in a stripe shape, the disclosure is not limited thereto. For example, the pixels PXL may be arranged in various pixel array forms.

In embodiments, each of the first to third sub-pixels SPX1, SPX2, and SPX3 may include unit pixels.

Figure 5:
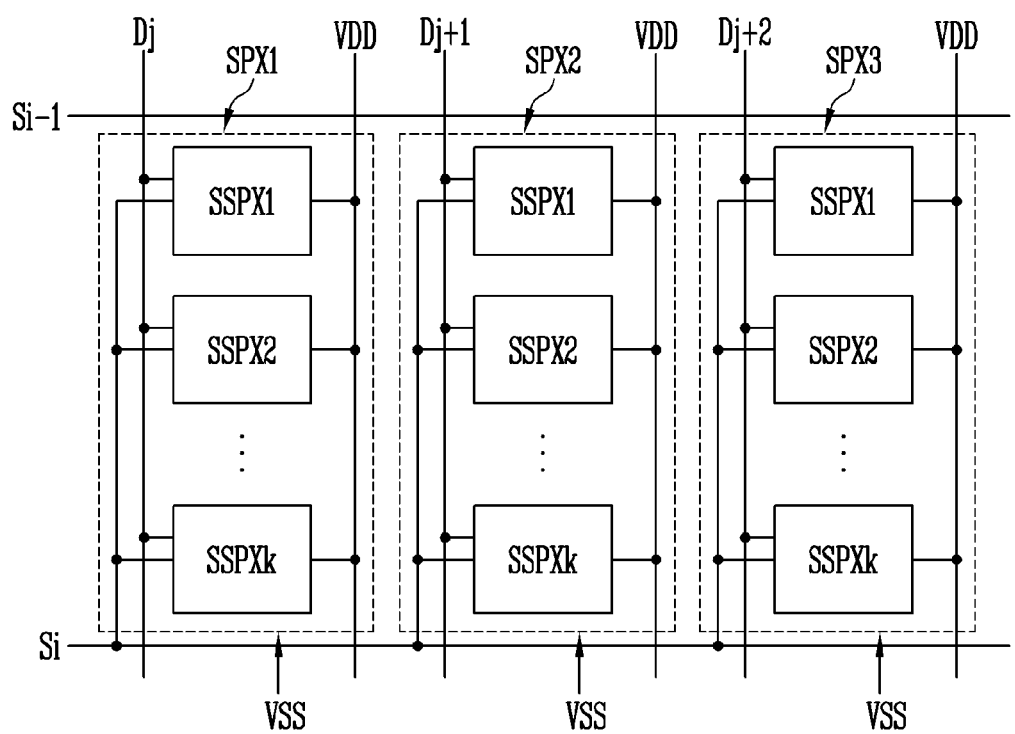
FIG. 5 is a circuit diagram schematically illustrating an example of a sub-pixel included in the display device of FIG. 4.

FIG. 5 is a circuit diagram schematically illustrating an example of a sub-pixel included in the display device of FIG. 4. FIG. 5 illustrates the first to third sub-pixels SPX1, SPX2, and SPX3 included in the display device of FIG. 4. Since the first to third sub-pixels SPX1, SPX2, and SPX3 are substantially equal to each other except that the first to third sub-pixels SPX1, SPX2, and SPX3 are electrically connected to corresponding data lines Dj, Dj+1, and Dj+2, respectively, the first to third sub-pixels SPX1, SPX2, and SPX3 will be described, focusing on the first sub-pixel SPX1.

The first to third sub-pixels SPX1, SPX2, and SPX3 may be disposed in areas, respectively, which are partitioned by scan lines Si−1 and Si (where i is a positive integer) and data lines Dj, Dj+1, and Dj+2 (where j is a positive integer). For example, the first sub-pixel SPX1 may be disposed in an area defined by i−1-th and i-th scan lines Si−1 and Si and j-th and j+1-th data lines Dj and Dj+1. However, the arrangement of the first to third sub-pixels SPX1, SPX2, and SPX3 is not limited thereto.

The first sub-pixel SPX1 may be electrically connected to a scan line Si and a data line Dj and also be electrically connected to a first power line and a second power line. Here, a first power supply VDD may be applied to the first power line, and a second power supply VSS may be applied to the second power line. Each of the first and second power lines may be a common line electrically connected to the first to third sub-pixels SPX1, SPX2, and SPX3. The first and second power supplies VDD and VSS may have different potentials to allow the first sub-pixel SPX1 to emit light. The first power supply VDD may have a voltage level higher than that of the second power supply VSS.

In embodiments, the first sub-pixel SPX1 may include first to k-th unit pixels SSPX1 to SSPXk (where k is an integer of two or more).

Each of the unit pixel SSPX1 to SSPXk may be electrically connected to the scan line Si and the data line Dj and also be electrically connected to the first power line and the second power line. Each of the first to k-th unit pixels SSPX1 to SSPXk may emit light having a luminance corresponding to a data signal transmitted through the data line Dj in response to a scan signal transmitted through the scan line Si. The first to k-th unit pixels SSPX1 to SSPXk may include substantially a same pixel structure or pixel circuit.

In other words, the first sub-pixel SPX1 may include first to k-th unit pixels SSPX1 to SSPXk that independently emit light, in response to a scan signal and a data signal.

In an embodiment, each of the first to k-th unit pixels SSPX1 to SSPXk (or the first to third sub-pixels SPX1 to SPX3) may be configured as an active pixel. However, the types, structures, and/or driving methods of the unit pixels capable of being applied to the display device according to the disclosure are not particularly limited. For example, the unit pixel may be configured of a pixel of the display device having various passive or active structures.

FIGS. 6A to 6D are circuit diagrams schematically illustrating an example of a unit pixel included in the sub-pixel of FIG. 5.

Figure 6A:
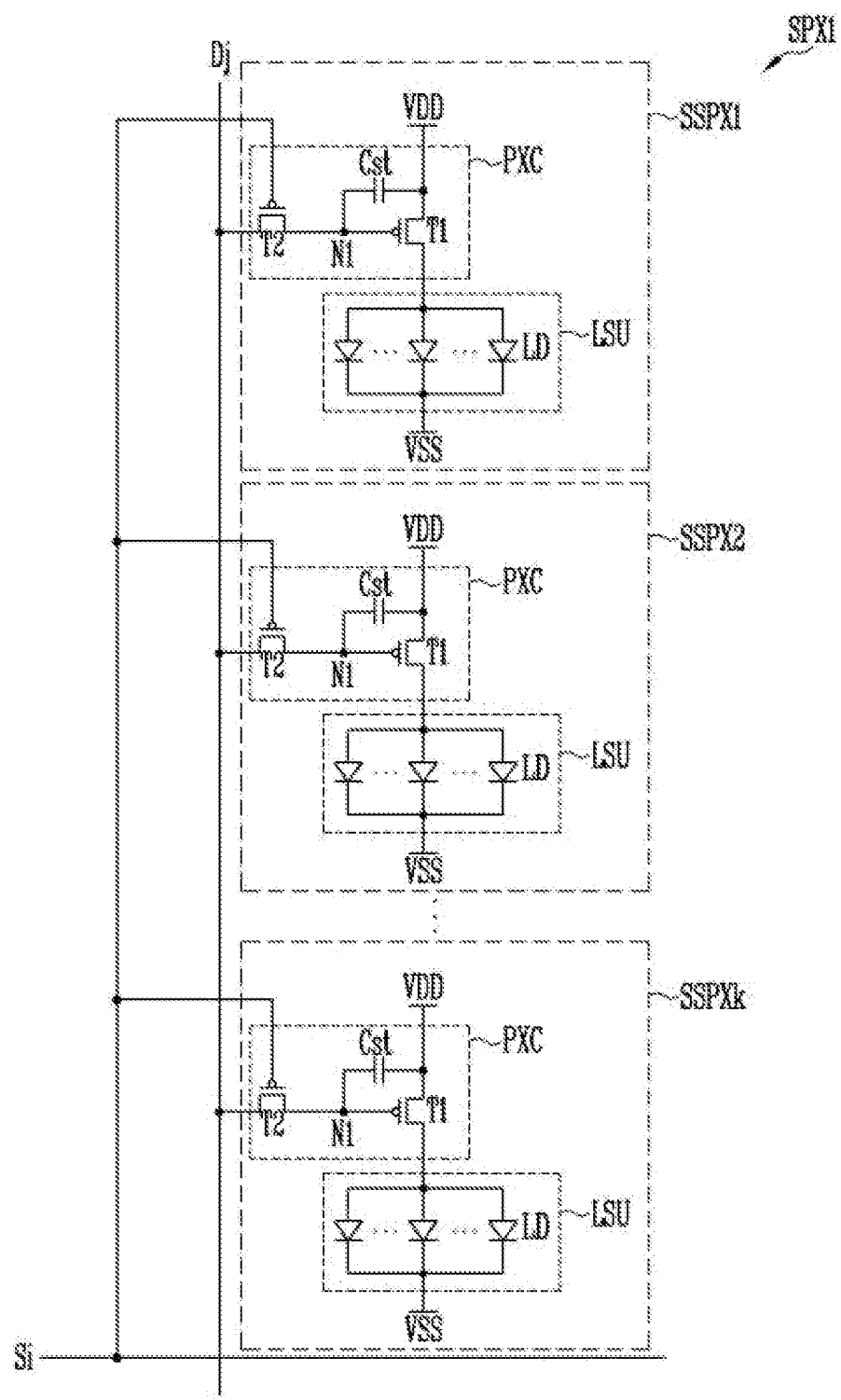
FIGS. 6A to 6D are circuit diagrams schematically illustrating an example of a unit pixel included in the sub-pixel of FIG. 5.

The first to k-th unit pixels SSPX1 to SSPXk shown in FIG. 6A may have a substantially identical or similar structure. A unit pixel SSPX shown in FIGS. 6B to 6D may be one of the first to k-th unit pixels SSPX1 to SSPXk provided in the first sub-pixel SPX1 of FIG. 6A. Therefore, as illustrated in FIGS. 6A to 6D, the first to k-th unit pixels SSPX1 to SSPXk will be collectively referred to as "unit pixel SSPX."

First, referring to FIG. 6A, the unit pixel SSPX may include a light source unit LSU that emits light having a luminance corresponding to a data signal. The unit pixel SSPX may selectively further include a pixel circuit PXC configured to drive the light source unit LSU.

In an embodiment, the light source unit LSU may include light emitting elements LD that are electrically connected to each other between the first power supply VDD and the second power supply VSS. In an embodiment, the light emitting elements LD may be electrically connected in parallel to each other, but the disclosure is not limited thereto. For example, light emitting elements LD may be electrically connected in a serial/parallel combination structure between the first power supply VDD and the second power supply VSS.

The first and second power supplies VDD and VSS may have different potentials to allow the light emitting elements LD to emit light. For example, the first power supply VDD may be set as a high-potential power supply, and the second power supply VSS may be set as a low-potential power supply. Here, a difference in potential between the first and second power supplies VDD and VSS may be set to a threshold voltage of the light emitting elements LD or greater at least during a light emitting period of the unit pixel SSPX (or the first sub-pixel SPX1).

Although FIG. 6A illustrates an embodiment in which the light emitting elements LD are electrically connected in parallel to each other in a same direction (e.g., in a forward direction) between the first power supply VDD and the second power supply VSS, the disclosure is not limited thereto. For example, some of the light emitting elements LD may be electrically connected to each other in the forward direction between the first and second power supplies VDD and VSS, thereby forming respective effective light sources, and other light emitting elements LD may be electrically connected to each other in a reverse direction. As another example, the unit pixel SSPX may include only a single light emitting element LD (e.g., a single effective light source electrically connected in the forward direction between the first and second power supplies VDD and VSS).

In an embodiment, the first end of each of the light emitting elements LD may be electrically connected in common to a corresponding pixel circuit PXC through a first electrode and may be electrically connected to the first power supply VDD through the pixel circuit PXC and the first power line. The second end of each of the light emitting elements LD may be electrically connected in common to the second power supply VSS through the second electrode and the second power line.

The light source unit LSU may emit light having a luminance corresponding to driving current supplied thereto through the corresponding pixel circuit PXC. Therefore, a predetermined image may be displayed in the display area DA (see FIG. 4).

The pixel circuit PXC may be electrically connected to the scan line Si and the data line Dj of the corresponding sub-pixel (for example, the first sub-pixel SPX1). For example, if the first sub-pixel SPX1 is disposed in an i-th row and a j-th column of the display area DA, the pixel circuit PXC of the unit pixel SSPX may be electrically connected to the i-th scan line Si and the j-th data line Dj of the display area DA.

The pixel circuit PXC may include a first transistor T1, a second transistor T2, and a storage capacitor Cst.

The first transistor (or driving transistor) T1 may be electrically connected between the first power supply VDD and the light source unit LSU. A gate electrode of the first transistor T1 may be electrically connected to a first node N1. The first transistor T1 may control driving current to be supplied to the light source unit LSU in response to a voltage of the first node N1.

The second transistor (or switching transistor) T2 may be electrically connected between the data line Dj and the first node N1. A gate electrode of the second transistor T2 may be electrically connected to the scan line Si.

In response to a scan signal of a gate-on voltage (e.g., a low voltage) supplied from the scan line Si, the second transistor T2 may be turned on to electrically connect the first node N1 to the data line Dj.

During each frame period, a data signal of a corresponding frame is supplied to the data line Dj. The data signal may be transmitted to the first node N1 via the second transistor T2. Therefore, a voltage corresponding to the data signal may be stored in the storage capacitor Cst.

An electrode of the storage capacitor Cst may be electrically connected to the first power supply VDD, and another electrode thereof may be electrically connected to the first node N1. The storage capacitor Cst may store a voltage corresponding to a data signal supplied to the first node N1 during each frame period and maintain the stored voltage until a data signal of a subsequent frame is supplied.

Although FIG. 6A illustrates that all of the transistors, e.g., the first and second transistors T1 and T2, included in the pixel circuit PXC are P-type transistors, the disclosure is not limited thereto. For example, at least one of the first and second transistors T1 and T2 may be changed to an N-type transistor.

Figure 6B:
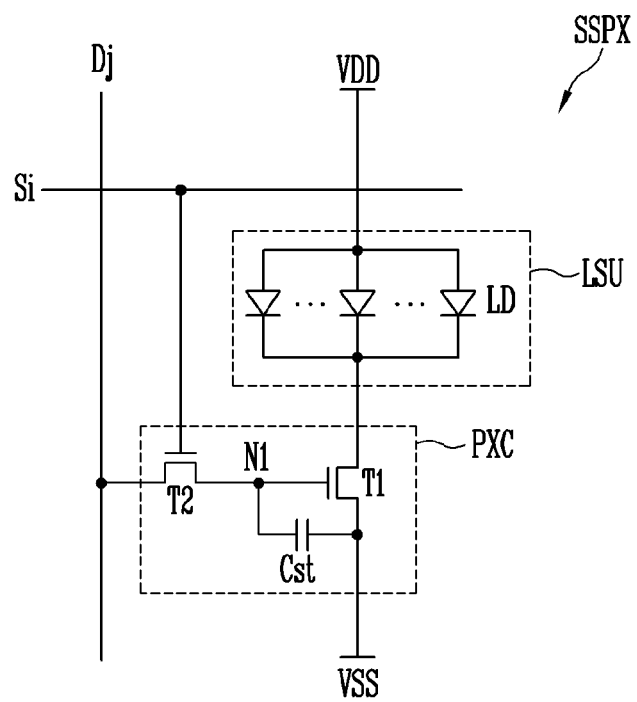

For instance, as shown in FIG. 6B, the first and second transistors T1 and T2 may be N-type transistors. In this case, the gate-on voltage of the scan signal for writing the data signal, supplied to the data line Dj in each frame period, in the unit pixel SSPX may be a high-level voltage. Likewise, the voltage of the data signal for turning on the first transistor T1 may be a voltage having a waveform opposite to that of the embodiment of FIG. 6A. For example, in the embodiment of FIG. 6B, as a gray scale value that is to be expressed increases, a data signal having a higher voltage level may be supplied.

The unit pixel SSPX shown in FIG. 6B is substantially similar in configuration and operation to the unit pixel SSPX of FIG. 6A, except that the connection positions of some circuit elements and the voltage levels of control signals (e.g., a scan signal and a data signal) are changed depending on a change in type of the transistor. Therefore, detailed descriptions of the unit pixel SSPX of FIG. 6B will be omitted.

The structure of the pixel circuit PXC is not limited to the embodiments shown in FIGS. 6A and 6B. In other words, the pixel circuit PXC may be formed of a pixel circuit which may have various structures and/or be operated by various driving methods. For example, the pixel circuit PXC may be configured in the same manner as that of an embodiment illustrated in FIG. 6C.

Figure 6C:
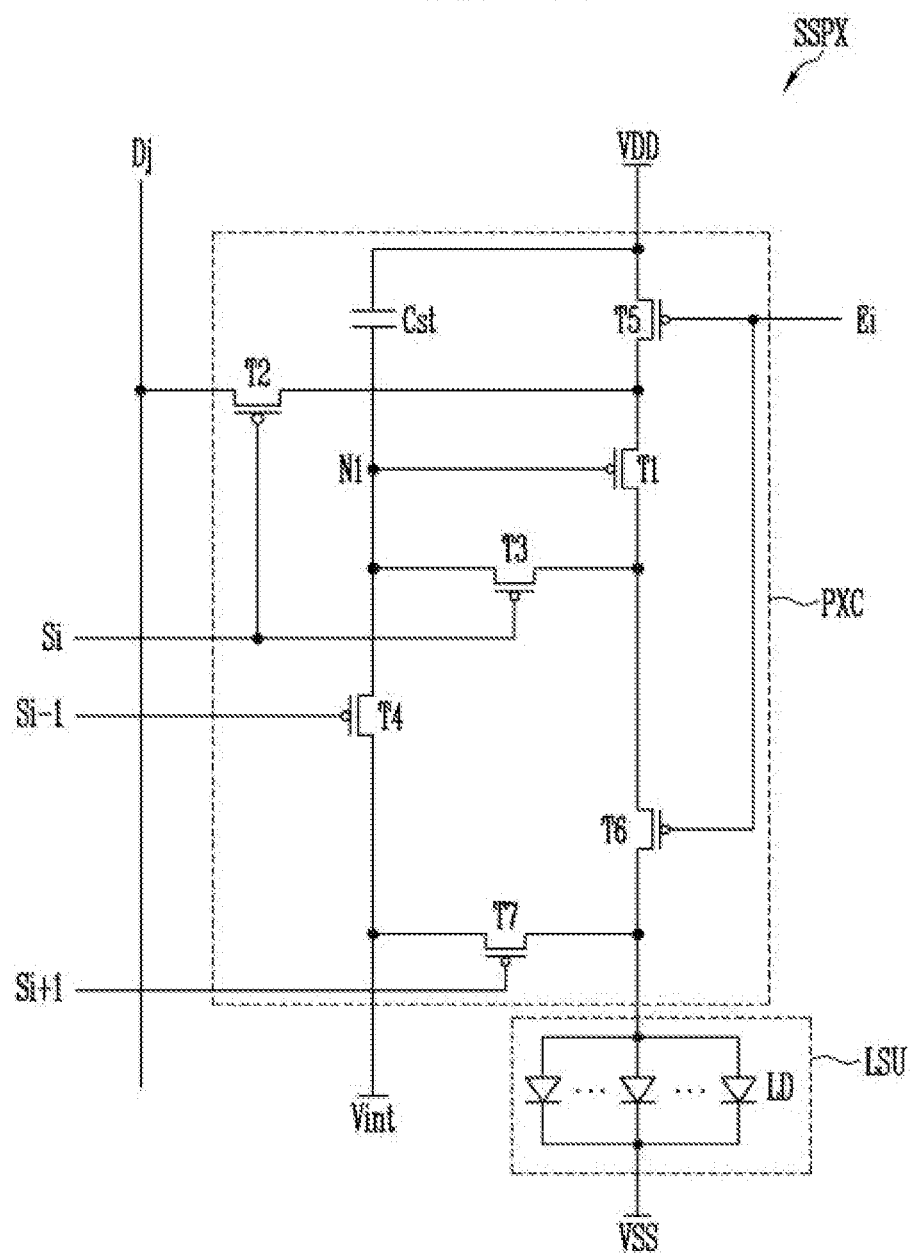

Referring to FIG. 6C, the pixel circuit PXC may be electrically connected not only to a corresponding scan line Si but also to at least another scan line (or another control line). For example, the pixel circuit PXC of the sub-pixel SPX (or the unit pixel SSPX included therein) disposed in the i-th row of the display area DA may be further electrically connected to an i−1-th scan line Si−1 and/or an i+1-th scan line Si+1. In an embodiment, the pixel circuit PXC may be electrically connected not only to the first and second power supplies VDD and VSS but also to other power supplies. For example, the pixel circuit PXC may also be electrically connected to an initialization power supply Vint.

In an embodiment, the pixel circuit PXC may include first to seventh transistors T1 to T7 and a storage capacitor Cst.

The first transistor T1 may be electrically connected between the first power supply VDD and the light source unit LSU. A first electrode (e.g., a source electrode) of the first transistor T1 may be electrically connected to the first power supply VDD through the fifth transistor T5, and a second electrode (e.g., a drain electrode) of the first transistor T1 may be electrically connected via the sixth transistor T6 to a first electrode (e.g., a first electrode of the corresponding sub-pixel SPX) of the light source unit LSU. A gate electrode of the first transistor T1 may be electrically connected to a first node N1. The first transistor T1 may control driving current to be supplied to the light source unit LSU in response to a voltage of the first node N1.

The second transistor T2 may be electrically connected between the data line Dj and the first electrode of the first transistor T1. A gate electrode of the second transistor T2 may be electrically connected to the corresponding scan line Si. When a scan signal having a gate-on voltage is supplied from the scan line Si, the second transistor T2 may be turned on to electrically connect the data line Dj to the first electrode of the first transistor T1. Hence, if the second transistor T2 is turned on, a data signal supplied from the data line Dj may be transmitted to the first transistor T1.

The third transistor T3 may be electrically connected between the second electrode (e.g., the drain electrode) of the first transistor T1 and the first node N1. A gate electrode of the third transistor T3 may be electrically connected to the corresponding scan line Si. In case that a scan signal of a gate-on voltage is supplied from the scan line Si, the third transistor T3 may be turned on to electrically connect the first transistor T1 in the form of a diode.

The fourth transistor T4 may be electrically connected between the first node N1 and the initialization power supply Vint. A gate electrode of the fourth transistor T4 may be electrically connected to a preceding scan line, e.g., an i−1-th scan line Si−1. In case that a scan signal of a gate-on voltage is supplied to the i−1-th scan line Si−1, the fourth transistor T4 may be turned on so that the voltage of the initialization power supply Vint may be transmitted to the first node N1. Here, the voltage of the initialization power supply Vint may be a minimum voltage of a data signal or less.

The fifth transistor T5 may be electrically connected between the first power supply VDD and the first transistor T1. A gate electrode of the fifth transistor T5 may be electrically connected to a corresponding emission control line, e.g., an i-th emission control line Ei. The fifth transistor T5 may be turned off in case that an emission control signal having a gate-off voltage (e.g., a high voltage) is supplied to the emission control line Ei, and may be turned on in other cases.

The sixth transistor T6 may be electrically connected between the first transistor T1 and the first electrode of the light source unit LSU. A gate electrode of the sixth transistor T6 may be electrically connected to a corresponding emission control line, e.g., the i-th emission control line Ei. The sixth transistor T6 may be turned off in case that an emission control signal of a gate-off voltage is supplied to the emission control line Ei, and may be turned on in other cases.

The seventh transistor T7 may be electrically connected between the first electrode of the light source unit LSU and the initialization power supply Vint (or a third power line configured to transmit initialization power). A gate electrode of the seventh transistor T7 may be electrically connected to any one of scan lines of a subsequent stage, e.g., to the i+1-th scan line Si+1. In case that a scan signal having a gate-on voltage is supplied to the i+1-th scan line Si+1, the seventh transistor T7 may be turned on so that the voltage of the initialization power supply Vint may be supplied to the first electrode of the light source unit LSU. In this case, during an initialization period during which the voltage of the initialization power supply Vint is transmitted to the power source unit LSU, the voltage of the first electrode of the light source unit LSU may be initialized.

A control signal for controlling an operation of the seventh transistor T7 may be variously changed. For example, the gate electrode of the seventh transistor T7 may be electrically connected to a scan line of a corresponding horizontal line, for example, an i-th scan line Si. In this case, in case that a scan signal having a gate-on voltage is supplied to the i-th scan line Si, the seventh transistor T7 may be turned on so that the voltage of the initialization power supply Vint may be supplied to the first electrode of the light source unit LSU.

The storage capacitor Cst may be electrically connected between the first power supply VDD and the first node N1. The storage capacitor Cst may store a voltage corresponding to the data signal applied to the first node N1 during each frame period and to the threshold voltage of the first transistor T1.

The operation of the unit pixel SSPX of FIG. 6C may be described with reference to FIG. 6E. FIG. 6E is a waveform diagram schematically illustrating examples of signals to be applied to the sub-pixel SSPX of FIG. 6C.

Referring to FIGS. 6C and 6E, a first scan signal GI (or a preceding scan signal) may be provided to the i–1-th scan line Si–1 shown in FIG. 6C, and a second scan signal GW may be provided to the i-th scan line Si (or the corresponding scan line) shown in FIG. 6C. The first scan signal GI may also be provided to the i+1-th scan line Si+1 shown in FIG. 6C. An emission control signal EM may be provided to the i-th emission control line Ei shown in FIG. 6C.

At a first time point t1, the first scan signal GI may transition from a voltage level of a gate-off voltage OFF (e.g., a high voltage) to a voltage level of a gate-on voltage ON (e.g., a low voltage) and maintain the voltage level of the gate-on voltage until a second time point t2. The second scan signal GW and the emission control signal EM may have the voltage level of the gate-off voltage.

In this case, the fourth transistor T4 may be turned on in response to the first scan signal GI having the gate-on voltage, and the third node N3 and the storage capacitor Cst may be initialized by the voltage of the initialization power supply Vint. In this case, the seventh transistor T7 may be turned on in response to the first scan signal GI having the gate-on voltage, and a voltage of the first electrode of the light source unit LSU may be initialized by the voltage of the initialization power supply Vint.

In other words, during a first period P1 (or an initialization period) between the first time point t1 and the second time point t2, the unit pixel SSPX may be initialized by the voltage of the initialization power supply Vint.

Thereafter, at the second time point t2, the first scan signal GI may transition to the voltage level of the gate-off voltage, and the second scan signal GW may transition to the voltage level of the gate-on voltage. Furthermore, the voltage level of the second scan signal GW may be maintained at the voltage level of the gate-on voltage (e.g., the low voltage) until a third time point t3.

In this case, the second transistor T2 and the third transistor T3 may be turned on in response to the second scan signal GW having the gate-on voltage. A data signal may be transmitted from the data line Dj to the storage capacitor Cst through the second transistor T2, the first transistor T1, and the third transistor T3. The storage capacitor Cst may store the data signal.

In other words, during a second period P2 (or a data writing period) between the second time point t2 and the third time point t3, a data signal may be provided to and stored in the unit pixel SSPX.

Subsequently, at a fourth time point t4, the emission control signal EM may transition from the voltage level of the gate-off voltage to the voltage level of the gate-on voltage and be maintained at the voltage level of the gate-on voltage until a fifth time point t5. The first scan signal GI and the second scan signal GW each may have the voltage level of the gate-off voltage.

In this case, the fifth transistor T5 and the sixth transistor T6 may be turned on in response to the emission control signal EM having the gate-on voltage. A current movement path for driving current may be formed from the first power supply VDD to the light source unit LSU through the fifth transistor T5, the first transistor T1, and the sixth transistor T6. Driving current corresponding to the voltage of the first node N1 (for example, a data signal stored in the storage capacitor Cst) may be supplied to the light source unit LSU. Therefore, the light source unit LSU may emit light having a luminance corresponding to the data signal.

In other words, during a third period P3 (or an emission period) between the fourth time point t4 and the fifth time point t5, the unit pixel SSPX may emit light having a luminance corresponding to the data signal.

At a sixth time point t6, waveforms of the first scan signal GI, the second scan signal GW, and the emission control signal EM may be identical to waveforms of the first scan signal GI, the second scan signal GW, and the emission control signal EM at the first time point t1. In other words, the first to sixth time points t1 to t6 may form a frame FRAME1, and the unit pixel SSPX may be repeatedly operated on a frame basis.

Although FIG. 6C illustrates that the transistors included in the pixel circuit PXC, e.g., the first to seventh transistors T1 to T7, are P-type transistors, the disclosure is not limited thereto. For example, at least one of the first to seventh transistors T1 to T7 may be changed to an N-type transistor.

In an embodiment, the pixel circuit PXC may be further electrically connected to another line as well as the data line Dj.

Figure 6D:
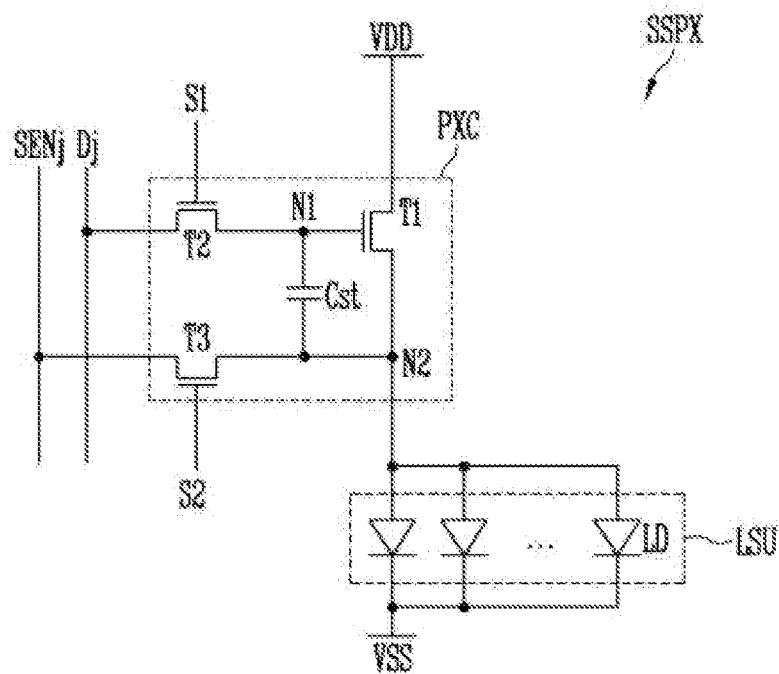
Figure 6E:
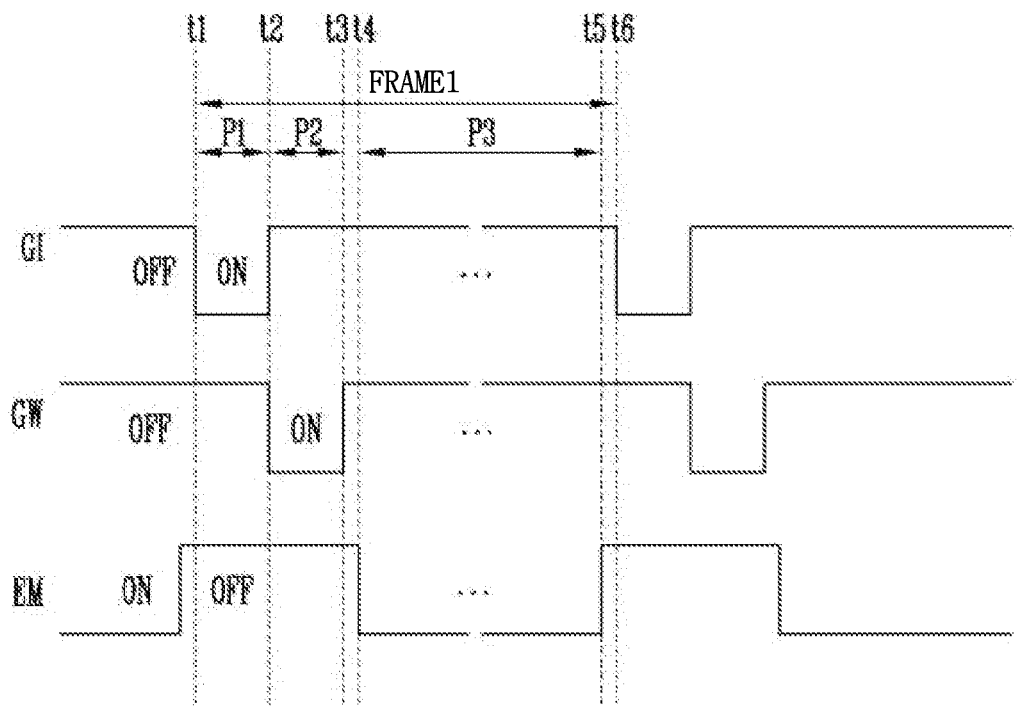
FIG. 6E is a waveform diagram schematically illustrating examples of signals to be applied to the sub-pixel of FIG. 6C.

Referring to FIG. 6D, the pixel circuit PXC may be electrically connected to a sensing line SENj. The pixel circuit PXC may include first to third transistors T1 to T3 and a storage capacitor Cst. Since the first and second transistors T1 and T2 and the storage capacitor Cst are substantially identical or similar to the first and second transistors T1 and T2 and the storage capacitor Cst described with reference to FIG. 6B, repetitive descriptions thereof will be omitted.

The third transistor T3 may be electrically connected between the sensing line SENj and a second node N2. The gate electrode of the third transistor T3 may be electrically connected to a second scan line S2 different from a first scan line Si (e.g., a i+1-th scan line Si+1 different from a i-th scan line Si).

The light source unit LSU may be electrically connected between the second node N2 and the second power line (for example, a power line to which the second power supply VSS is applied).

The third transistor T3 may be turned on in response to a scan signal of the gate-on voltage transmitted from the second scan line S2 to electrically connect the sensing line SENj to the second node N2.

For example, in case that the third transistor T3 is turned on with driving current corresponding to reference voltage flowing in the first transistor T1, the driving current flowing through the first transistor T1 may be provided to an external sensing device through the third transistor T3 and the sensing line SENj, and a signal corresponding to the characteristics of the first transistor T1 (e.g., the threshold voltage) based on the driving current may be output through the sensing line SENj to an external device.

Furthermore, the structure of the unit pixel SSPX which may be applied to the disclosure is not limited to that in the embodiments shown in FIGS. 6A to 6D, and the unit pixel S SPX may have various structures. For example, the pixel circuit PXC included in the unit pixel SSPX may be formed of a pixel circuit which may have various structures and/or be operated by various driving methods. The unit pixel SSPX may be formed in a passive light emitting display panel or the like. In this case, the pixel circuit PXC may be omitted, and each of the first and second electrodes of the light source unit LSU may be directly and electrically connected to the scan line Si, the data line Dj, a power line, and/or a control line.

Figure 7:
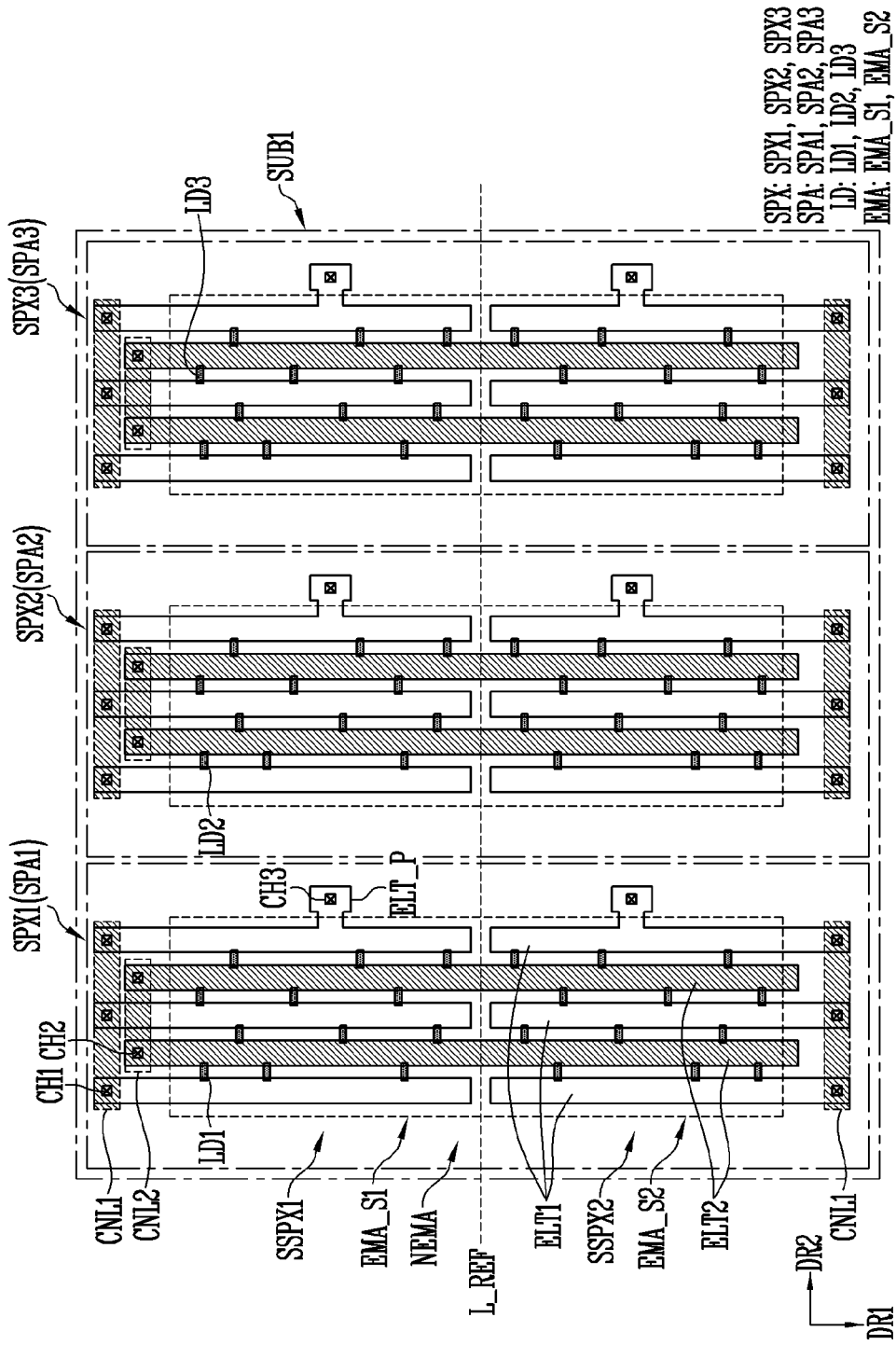
FIG. 7 is a plan view schematically illustrating an example of a sub-pixel included in the display device of FIG. 4.
Figure 8:
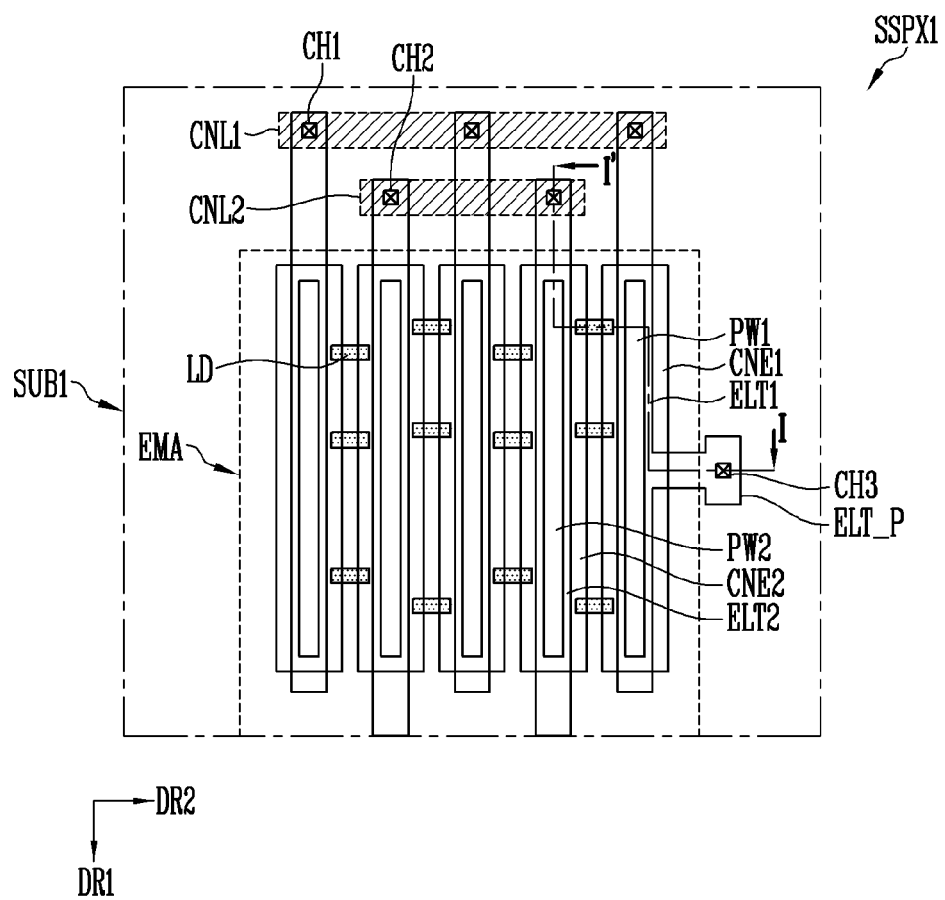
FIG. 8 is a plan view schematically illustrating an example of a first unit pixel included in a first sub-pixel of the sub-pixels of FIG. 7.

FIG. 7 is a plan view schematically illustrating an example of sub-pixels included in the display device of FIG. 4. FIG. 7 illustrates the structure of first to third sub-pixels SPX1 to SPX3 based on a light source unit LSU (refer to FIGS. 6A to 6D) (or a light emitting element layer) included in the first to third sub-pixels SPX1 to SPX3. FIG. 8 is a plan view schematically illustrating an example of a first unit pixel included in a first sub-pixel of the sub-pixels of FIG. 7. The first to third sub-pixels SPX1 to SPX3 may be identical with each other. Since first and second unit pixels SSPX1 and SSPX2 included in each of the first to third sub-pixels SPX1 to SPX3 may be top-and-bottom symmetrical structure based on a reference line L_REF, the light source unit LSU will be described, focusing on the first sub-pixel SPX1 and the first unit pixel SSPX1.

Referring to FIGS. 7 and 8, the first sub-pixel SPX1 may include a first electrode ELT1 and a second electrode ELT2 disposed at positions spaced apart from each other in a first sub-pixel area SPA1, and at least one light emitting element LD electrically connected between the first and second electrodes ELT1 and ELT2.

In an embodiment, first, second, and third light emitting elements LD1, LD2, and LD3 included in each of the first to third sub-pixels SPX1 to SPX3 may emit light having the same color or different colors. For example, each first light emitting element LD1 may be a red light emitting diode configured to emit red light. Each second light emitting element LD2 may be a green light emitting diode configured to emit green light. Each third light emitting element LD3 may be a blue light emitting diode configured to emit blue light.

For example, all of the first, second, and third light emitting elements LD1, LD2, and LD3 may be formed of blue light emitting diodes configured to emit blue light. In this case, in order to form a full-color pixel PXL, a light conversion layer for converting the color of light emitted from the corresponding sub-pixel SPX and/or a color filter may be disposed on at least some of the first to third sub-pixels SPX1, SPX2, and SPX3.

In an embodiment, the first electrode ELT1 and the second electrode ELT2 may be disposed at positions spaced apart from each other in the first sub-pixel area SPA1 such that at least predetermined areas thereof face each other. For example, the first and second electrodes ELT1 and ELT2 each may extend in the first direction DR1 and may be spaced apart from each other by a predetermined distance in the second direction DR2 that is substantially perpendicular to or intersects the first direction DR1. However, the disclosure is not limited thereto. For example, the shapes and/or mutual arrangement relationship of the first and second electrodes ELT1 and ELT2 may be changed in various ways.

In embodiments, the first sub-pixel area SPA1 may include an emission area EMA and a non-emission area NEMA. The emission area EMA may include sub-emission areas separated from each other. The first electrode ELT1 may be disposed in each of the sub-emission areas. The second electrode ELT2 may be disposed in the entirety of the emission area EMA, for example, across the sub-emission areas. Here, the emission area EMA may be a unit area which expresses (or displays) single color light, be separated from an emission area configured to emit another color of light, and be defined by a pixel defining layer (or a bank or a light shielding pattern) or the like which blocks light emitted from a light emitting element LD from passing through other areas.

For example, as illustrated in FIG. 7, the first sub-pixel area SPA1 (or second sub-pixel area SPA2, third sub-pixel area SPA3) may include an emission area EMA and a non-emission area NEMA. The emission area EMA may include first and second sub-emission areas EMA_S1 and EMA_S2 separated from each other in the first direction DR1 based on the reference line L_REF. The first electrode ELT1 may be disposed in each of the first and second sub-emission areas EMA_S1 and EMA_S2 based on the reference line L_REF. The second electrode ELT2 may be disposed in the entirety of the emission area EMA, for example, across the first and second sub-emission areas EMA_S1 and EMA_S2. The first electrode ELT1 disposed in the second sub-emission area EMA_S2 may be spaced, in the first direction DR1, apart from the first electrode ELT1 disposed in the first sub-emission area EMA_S1, and electrically separated or insulated from the first electrode ELT1 disposed in the first sub-emission area EMA_S1.

Although FIG. 7 illustrates that the emission area EMA include the first and second sub-emission areas EMA_S1 and EMA_S2, this is for illustrative purposes. For example, the emission area EMA may include three or more sub-emission areas. Furthermore, although FIG. 7 illustrates that the first and second sub-emission areas EMA_S1 and EMA_S2 are successive (or adjacent) to each other, this is for illustrative purposes. The first and second sub-emission areas EMA_S1 and EMA_S2 may be spaced apart from each other by a pixel defining layer (or a bank) or the like disposed therebetween.

The first electrode ELT1 may be electrically connected to a first connection electrode CNL1 (or a first connection line) extending in the second direction DR2. The first electrodes ELT1 included in each sub-emission area may be electrically connected to each other by the first connection electrode CNL1.

The second electrode ELT2 may be electrically connected to a second connection electrode CNL2 (or a second connection line) extending in the second direction DR2. The second connection electrode CNL2 may be electrically connected to the second power line (for example, a power line to which the second power supply VSS is applied) described with reference to FIGS. 6A, 6C, and 6D.

Although FIG. 7 illustrates that the second connection electrode CNL2 is disposed in only the corresponding sub-pixel SPX, this is for illustrative purposes, and the disclosure is not limited thereto. For example, the second connection electrode CNL2 may extend to an adjacent sub-pixel SPX (e.g., the second and third sub-pixels SPX2 and SPX3 based on the first sub-pixel SPX1).

In embodiments, the first electrode ELT1 may include a protrusion ELT_P. For example, the protrusion ELT_P may protrude from a central portion of the first electrode ELT1 to the non-emission area NEMA in the second direction DR2. The protrusion ELT_P may be electrically connected to the pixel circuit PXC (or the first transistor T1) described with reference to FIGS. 6A to 6D. Depending on the arrangement of the first transistor T1, the protrusion ELT_P may be omitted, and the first connection electrode CNL1 may be electrically connected to the pixel circuit PXC (or the first transistor T1).

In an embodiment, each of the first and second electrodes ELT1 and ELT2 may have a single-layer or multi-layer structure. For example, the first electrode ELT1 may have a multi-layer structure including a first reflective electrode and a first conductive capping layer. The second electrode ELT2 may have a multi-layer structure including a second reflective electrode and a second conductive capping layer.

In an embodiment, the first electrode ELT1 may be electrically connected to the first connection electrode CNL1. The first electrode ELT1 may be integrally and electrically connected to the first connection electrode CNL1. For example, the first electrode ELT1 may be formed of at least one branch diverging from the first connection electrode CNL1. In case that the first electrode ELT1 and the first connection electrode CNL1 are formed integrally with (or integral with) each other, the first connection electrode CNL1 may be regarded as an area of the first electrode ELT1. However, the disclosure is not limited thereto. For example, in an embodiment, the first electrode ELT1 and the first connection electrode CNL1 may be individually formed and electrically connected to each other through at least one contact hole CH1, a via hole, or the like.

In an embodiment, the first connection electrode CNL1 may have a single-layer or multi-layer structure. For example, the first connection electrode CNL1 may include a first sub-connection electrode integrally connected with (or integral with) the first reflective electrode, and a second sub-connection electrode integrally and electrically connected with the first conductive capping layer. In an embodiment, the first connection electrode CNL1 and the first electrode ELT1 may have a same cross-sectional structure (or stacked structure), but the disclosure is not limited thereto.

In an embodiment, the second electrode ELT2 may be electrically connected to the second connection electrode CNL2. For example, the second connection electrode CNL2 may be independently formed from the second electrode ELT2 and electrically connected to the second electrode ELT2 through at least one second contact hole CH2, a via hole, or the like. However, the disclosure is not limited thereto. For instance, in an embodiment, the second electrode ELT2 may be integrally coupled to the second connection electrode CNL2. For example, the second electrode ELT2 may be formed of at least one branch diverging from the second connection electrode CNL2. In case that the second electrode ELT2 and the second connection electrode CNL2 are integral with each other, the second connection electrode CNL2 may be regarded as an area of the second electrode ELT2.

In an embodiment, the second connection electrode CNL2 may have a single-layer or multi-layer structure in a manner similar to that of the first connection electrode CNL1.

Referring to FIG. 8, a first partition wall (or first bank) PW1 may be disposed under the first electrode ELT1 and overlap an area of the first electrode ELT1. A second partition wall PW2 may be disposed under the second electrode ELT2 and overlap an area of the second electrode ELT2. The first and second partition walls PW1 and PW2 may be disposed in the emission area EMA at positions spaced apart from each other, and make areas of the first and second electrodes ELT1 and ELT2 protrude upward. For example, the first electrode ELT1 may be disposed on the first partition wall PW1 and protrude in a height direction (or a thickness direction) of the base layer SUB1 by the first partition wall PW1. The second electrode ELT2 may be disposed on the second partition wall PW2 and protrude in the height direction of the base layer SUB1 by the second partition wall PW2.

In an embodiment, at least one light emitting element LD, e.g., light emitting elements LD, may be arranged between the first and second electrodes ELT1 and ELT2. Light emitting elements LD may be electrically connected in parallel to each other in the emission area EMA (or the first sub-emission area EMA_S1, refer to FIG. 7) in which the first electrode ELT1 and the second electrode ELT2 are disposed to face each other.

Although FIG. 8 illustrates that the light emitting elements LD are arranged between the first and second electrodes ELT1 and ELT2 in the second direction DR2, e.g., in a horizontal direction, the arrangement direction of the light emitting elements LD is not limited thereto. For example, at least one of the light emitting elements LD may be oriented in a diagonal direction.

Each of the light emitting elements LD may be electrically connected between the first electrode ELT1 and the second electrode ELT2. For example, the respective first ends EP1 of the light emitting elements LD may be electrically connected to the first electrode ELT1. The respective second ends EP2 of the light emitting elements LD may be electrically connected to the second electrode ELT2.

In an embodiment, the first end of each of the light emitting elements LD may be electrically connected to the corresponding first electrode ELT1 through at least one contact electrode, e.g., a first contact electrode CNE1, rather than being directly disposed on the first electrode ELT1. However, the disclosure is not limited thereto. For example, in an embodiment, the first ends of the light emitting elements LD may directly contact the first electrode ELT1 to be electrically connected to the first electrode ELT1.

Likewise, the second end of each of the light emitting elements LD may be electrically connected to the corresponding second electrode ELT2 through at least one contact electrode, e.g., a second contact electrode CNE2, rather than being directly disposed on the second electrode ELT2. However, the disclosure is not limited thereto. For example, in an embodiment, the second end of each of the light emitting elements LD may directly contact the second electrode ELT2 to be electrically connected to the second electrode ELT2.

In an embodiment, each of the light emitting elements LD may be a light emitting diode which is made of material having an inorganic crystal structure and has a subminiature size, e.g., a size corresponding to the nanometer or micrometer scale. For example, each of the light emitting elements LD may be a subminiature light emitting element (e.g., rod-type light emitting diode) having a size ranging from the nanometer scale to the micrometer scale, as illustrated in any one of FIGS. 1A to 3B. However, a type of light emitting elements LD which may be applied to the disclosure is not limited thereto. For example, the light emitting element LD may be formed by a growth method and be a light emitting diode having a core-shell structure having a size corresponding to, e.g., the nanometer scale to the micrometer scale.

In an embodiment, the light emitting elements LD may be prepared in diffused form in a predetermined solution and be supplied to the emission area EMA of each sub-pixel SPX by an inkjet printing method or a slit coating method. Furthermore, the light emitting elements LD may be simultaneously supplied to the first and second sub-emission areas EMA_S1 and EMA_S2 in the emission area EMA. For example, the light emitting elements LD may be mixed with a volatile solvent and be supplied to the emission area EMA. Here, if predetermined voltages are supplied to the first and second electrodes ELT1 and ELT2 of the sub-pixel SPX, an electric field is formed between the first and second electrodes ELT1 and ELT2, whereby the light emitting elements LD are self-aligned between the first and second electrodes ELT1 and ELT2. After the light emitting elements LD have been aligned, the solvent may be removed by a volatilization method or other methods. In this way, the light emitting elements LD may be reliably arranged between the first and second electrodes ELT1 and ELT2. Furthermore, since the first contact electrode CNE1 and the second contact electrode CNE2 are formed on the first ends EP1 and the second ends EP2 of the light emitting elements LD, the light emitting elements LD may be reliably and electrically connected between the first and second electrodes ELT1 and ELT2.

Since a separate circuit element, a separate line, or the like is not disposed between the first and second electrodes ELT1 and ELT2 and the base layer SUB1, interference resulting from a circuit element or a conductive pattern may be prevented from occurring in the step of forming the electric field between the first and second electrodes ELT1 and ELT2. Therefore, the efficiency of alignment of the light emitting elements LD may be enhanced.

In an embodiment, the first contact electrode CNE1 may be formed on the first ends EP1 of the light emitting elements LD and at least one area of the first electrode ELT1 corresponding to the first ends EP1, whereby the first ends EP1 of the light emitting elements LD may be physically and/or electrically connected to the first electrode ELT1. Likewise, the second contact electrode CNE2 may be formed on the second ends EP2 of the light emitting elements LD and at least one area of the second electrode ELT2 corresponding to the second ends EP2, whereby the second ends EP2 of the light emitting elements LD may be physically and/or electrically connected to the second electrode ELT2.

The light emitting elements LD disposed in the emission area EMA may form a light source of the corresponding unit pixel (and the sub-pixel SPX). For example, the light emitting elements LD disposed in the first and second sub-emission areas EMA_S1 and EMA_S2 shown in FIG. 7 may form a light source. For example, if driving current flows through at least one sub-pixel SPX (or each of the first and second unit pixels SSPX1 and SSPX2) during each frame period, the light emitting elements LD that are electrically connected in the forward direction between the first and second electrodes ELT1 and ELT2 of the sub-pixel SPX may emit light having a luminance corresponding to the driving current.

FIGS. 9A to 9D are cross-sectional views schematically illustrating examples of the unit pixel, taken along line I-I' of FIG. 8. FIGS. 9A to 9D each illustrates a sub-pixel area SPA (e.g., the first sub-pixel area SPA1) formed in the display panel PNL. In an embodiment, the cross-sectional structures of the first, second, and third sub-pixels SPX1, SPX2, and SPX3 described above and the first and second unit pixels SSPX1 and SSPX2 included therein may be substantially identical or similar to each other. Therefore, for the sake of explanation, as illustrated in FIGS. 9A to 9D, the structures of the first, second, and third sub-pixels SPX1, SPX2, and SPX3 and the first and second unit pixels SSPX1 and SSPX2 included therein will be described, focusing on the first unit pixel SSPX1.

Figure 9A:
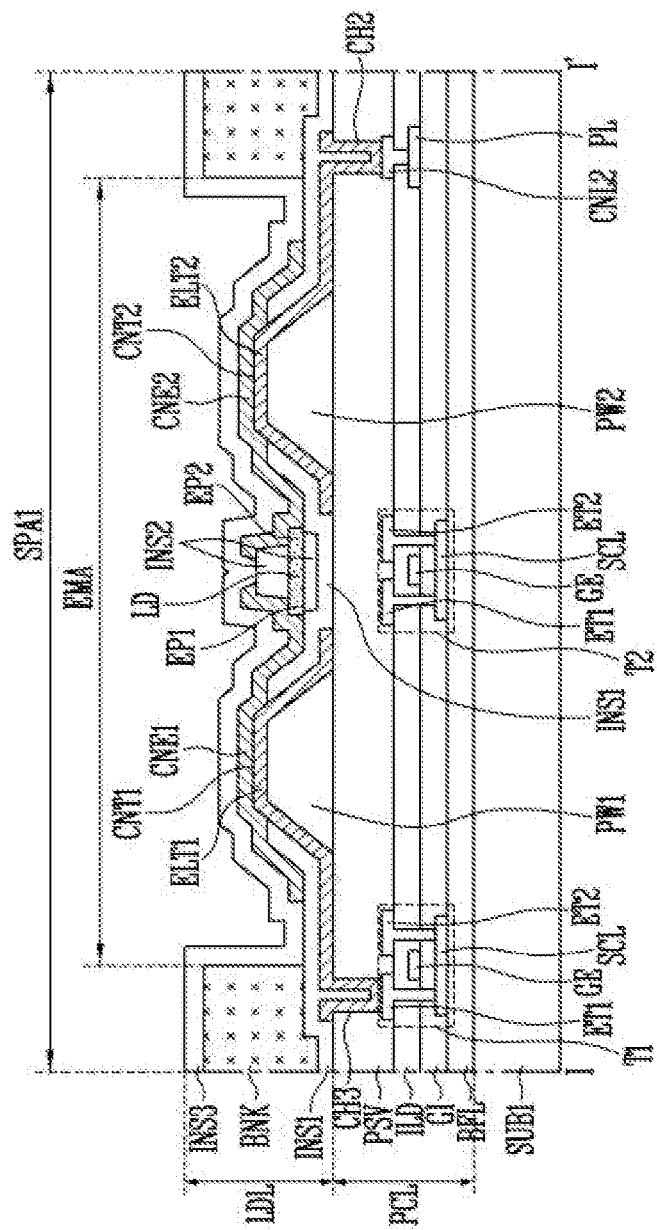
FIGS. 9A to 9D are cross-sectional views schematically illustrating examples of the unit pixel, taken along line I-I' of FIG. 8.

Referring to FIG. 9A, a pixel circuit layer PCL and a display element layer LDL may be successively disposed in each sub-pixel area SPA of the base layer SUB1. In an embodiment, the pixel circuit layer PCL and the display element layer LDL may be formed in the entirety of the display area DA of the display panel PNL.

In an embodiment, the pixel circuit layer PCL may include circuit elements which constitute the pixel circuits PXC of the sub-pixels SPX. The display element layer LDL may include light emitting elements LD of the sub-pixels SPX (or the unit pixels SSPX).

For example, in the first sub-pixel area SPA1 on the base layer SUB1, the pixel circuit layer PCL including circuit elements constituting the pixel circuit PXC of the corresponding first sub-pixel SPX1, and the display element layer LDL including at least one light emitting element LD, e.g., first light emitting elements LD1, provided in the first sub-pixel SPX1 may be successively disposed on a surface of the base layer SUB1.

In an embodiment, the pixel circuit layer PCL may include circuit elements which are formed in the first sub-pixel area SPA1 and form the pixel circuit PXC of the first sub-pixel SPX1 (or the first unit pixel SSPX1). For example, the pixel circuit layer PCL may include transistors disposed in the first sub-pixel area SPA1, e.g., the first and second transistors T1 and T2 of FIG. 6A. Although not illustrated in FIG. 9A, the pixel circuit layer PCL may include a storage capacitor Cst disposed in the sub-pixel area SPA, various signal lines (e.g., the scan line Si and the data line Dj illustrated in FIG. 6A) electrically connected to the pixel circuit PXC, and various power lines (e.g., a first power line (not illustrated) and a second power line PL configured to respectively transmit the first power supply VDD and the second power supply VSS) electrically connected to the pixel circuit PXC and/or the light emitting elements LD.

In an embodiment, transistors, e.g., first and second transistors T1 and T2, provided in the pixel circuit PXC may have substantially an identical or similar cross-sectional structure. However, the disclosure is not limited thereto. In an embodiment, at least some of the transistors may have different types and/or structures.

The pixel circuit layer PCL may include insulating layers. For example, the pixel circuit layer PCL may include a buffer layer BFL, a gate insulating layer GI, an interlayer insulating layer ILD, and a passivation layer PSV which are successively stacked on the surface of the base layer SUB1.

In an embodiment, the buffer layer BFL may prevent impurities from diffusing into the circuit elements. The buffer layer BFL may be formed of a single layer, or may be formed of multiple layers having double or more layers. In case that the buffer layer BFL has a multi-layer structure, the respective layers may be formed of the same material or different materials. In an embodiment, the buffer layer BFL may be omitted.

In an embodiment, each of the first and second transistors T1 and T2 may include a semiconductor layer SCL, a gate electrode GE, a first transistor electrode ET1, and a second transistor electrode ET2. Although FIG. 9A illustrates that each of the first and second transistors T1 and T2 includes the first transistor electrode ET1 and the second transistor electrode ET2 that are formed separately from the semiconductor layer SCL, the disclosure is not limited thereto. For example, in an embodiment, the first and/or second electrode ET1 and/or ET2 provided in at least one transistor disposed in each sub-pixel area SPA may be integral with the corresponding semiconductor layer SCL.

The semiconductor layer SCL may be disposed on the buffer layer BFL. For example, the semiconductor layer SCL may be disposed between the gate insulating layer GI and the base layer SUB1 on which the buffer layer BFL is formed. The semiconductor layer SCL may include a first area which contacts a first transistor electrode ET1, a second area which contacts a second transistor electrode ET2, and a channel area disposed between the first and second areas. In an embodiment, one of the first and second areas may be a source area, and the other may be a drain area.

In an embodiment, the semiconductor layer SCL may be a semiconductor pattern formed of polysilicon, amorphous silicon, an oxide semiconductor, etc. The channel area of the semiconductor layer SCL may be an intrinsic semiconductor, which is an undoped semiconductor pattern. Each of the first and second areas of the semiconductor layer SCL may be a semiconductor pattern doped with a predetermined impurity.

The gate electrode GE may be disposed on the semiconductor layer SCL with the gate insulating layer GI interposed therebetween. For example, the gate electrode GE may be disposed between the gate insulating layer GI and the interlayer insulating layer ILD and overlap at least one area of the semiconductor layer SCL.

The first and second transistor electrodes ET1 and ET2 may be disposed over the semiconductor layer SCL and the gate electrode GE with at least one interlayer insulating layer ILD interposed therebetween. For example, the first and second transistor electrodes ET1 and ET2 may be disposed between the interlayer insulating layer ILD and the passivation layer PSV. The first and second transistor electrodes ET1 and ET2 may be electrically connected to the semiconductor layer SCL. For example, the first and second transistor electrodes ET1 and ET2 may be respectively connected to the first area and the second area of the semiconductor layer SCL through contact holes which pass through the gate insulating layer GI and the interlayer insulating layer ILD.

In an embodiment, one of the first and second transistor electrodes ET1 and ET2 of at least one transistor (e.g., the first transistor T1 shown in FIG. 6A) provided in the pixel circuit PXC may be electrically connected, through a third contact hole CH3 passing through the passivation layer PSV, to the first electrode ELT1 of the light source unit LSU disposed over the passivation layer PSV.

In an embodiment, at least one signal line and/or at least one power line that is electrically connected to the sub-pixel SPX may be disposed on a layer identical with that of an electrode of each of the circuit elements that form the pixel circuit PXC. For example, the second power line PL for supplying the second power supply VSS may be disposed on a layer identical with that of the gate electrode GE of each of the first and second transistors T1 and T2 and electrically connected to the second electrode ELT2 of the light source unit LSU that is disposed over the passivation layer PSV, both through the second connection electrode CNL2 (or the second connection line, or a bridge pattern) disposed on the same layer as that of the first and second transistor electrodes ET1 and ET2 and through at least one second contact hole CH2 passing through the passivation layer PSV. However, the structures and/or positions of the second power line PL, etc. may be changed in various ways.

In an embodiment, the display element layer LDL may include first and second partition walls PW1 and PW2, first and second electrodes ELT1 and LET2, a first insulating layer INS1, light emitting elements LD, a second insulating layer INS2, first and second contact electrodes CNE1 and CNE2, and a third insulating layer INS3, which are successively disposed and/or formed on the pixel circuit layer PCL.

The first and second partition walls PW1 and PW2 may be disposed on the pixel circuit layer PCL. The first and second partition walls PW1 and PW2 may be disposed at positions spaced apart from each other in the emission area EMA. The first and second partition walls PW1 and PW2 may protrudes in a height direction on the pixel circuit layer PCL. In an embodiment, the first and second partition walls PW1 and PW2 may have substantially the same height, but the disclosure is not limited thereto.

In an embodiment, the first partition wall PW1 may be disposed between the pixel circuit layer PCL and the first electrode ELT1. The first partition wall PW1 may be disposed adjacent to the first ends EP1 of the light emitting elements LD. For example, a sidewall of the first partition wall PW1 may be positioned adjacent to the first ends EP1 of the light emitting elements LD and disposed to face the first ends EP1.

In an embodiment, the second partition wall PW2 may be disposed between the pixel circuit layer PCL and the second electrode ELT2. The second partition wall PW2 may be disposed adjacent to the second ends EP2 of the light emitting elements LD. For example, a sidewall of the second partition wall PW2 may be positioned adjacent to the second ends EP2 of the light emitting elements LD and be disposed to face the second ends EP2.

Figure 9B:
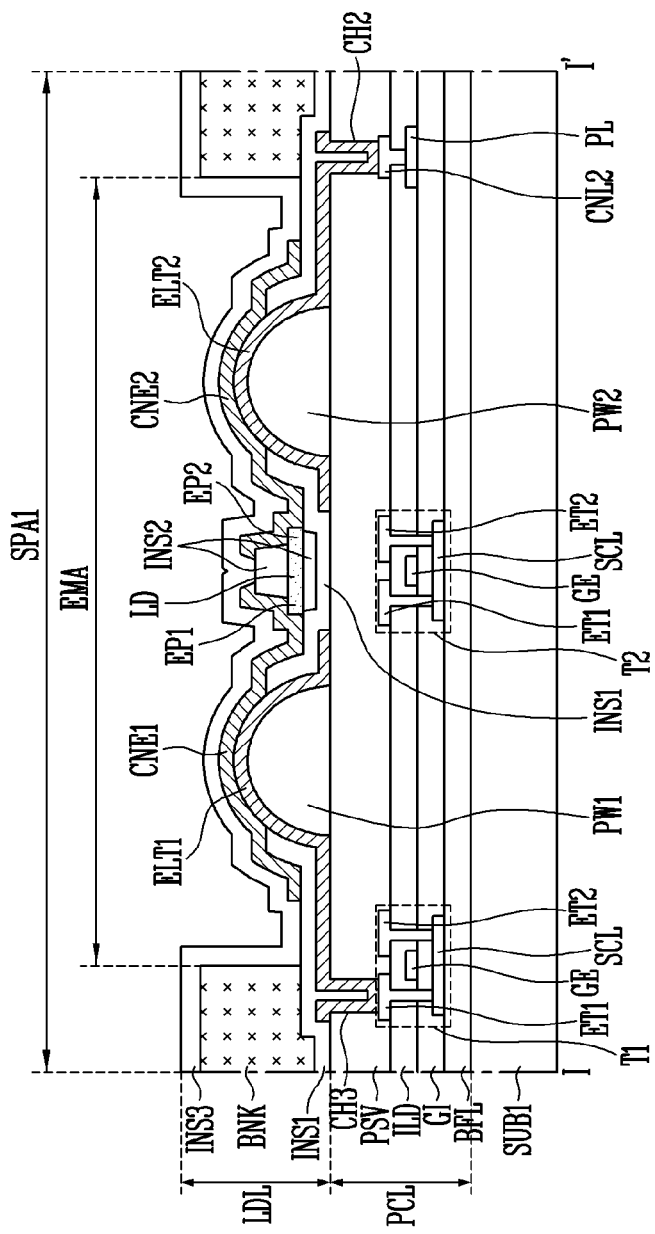

In an embodiment, each of the first and second partition walls PW1 and PW2 may have various shapes. For example, as illustrated in FIG. 9A, each of the first and second partition walls PW1 and PW2 may have a cross-sectional shape of a trapezoid, a width of which reduces from a bottom to a top thereof. In this case, each of the first and second partition walls PW1 and PW2 may have an inclined surface on at least one side thereof. As another example, as illustrated in FIG. 9B, each of the first and second partition walls PW1 and PW2 may have a semicircular or a semielliptical cross-section, a width of which reduces from a bottom to a top thereof. In this case, each of the first and second partition walls PW1 and PW2 may have a curved surface on at least one side thereof. In other words, the shape of each of the first and second partition walls PW1 and PW2 is not limited to a particular shape, and may be changed in various ways. In an embodiment, at least one of the first and second partition walls PW1 and PW2 may be omitted, or the position thereof may be changed.

Each of the first and second partition walls PW1 and PW2 may include insulating material having inorganic material and/or organic material. For example, the first and second partition walls PW1 and PW2 may include at least one inorganic layer including various inorganic insulating materials such as $SiN_x$ and $SiO_x$. As another example, the first and second partition walls PW1 and PW2 may include at least one organic layer and/or at least one photoresist layer containing various organic insulating materials, or may form a single- or multi-layer insulator containing organic/inorganic materials in combination. In other words, the materials of the first and second partition walls PW1 and PW2 may be variously changed.

In an embodiment, each of the first and second partition walls PW1 and PW21 may function as a reflective member. For example, the first and second partition walls PW1 and PW2, along with the first and second electrodes ELT1 and ELT2 provided on the first and second partition walls PW1 and PW2, may function as reflectors that guide light, emitted from each light emitting element LD, in a desired direction, thereby enhancing the light efficiency of the pixel PXL.

The first and second electrodes ELT1 and ELT2 may be respectively disposed over the first and second partition walls PW1 and PW2. The first and second electrodes ELT1 and ELT2 may be disposed at positions spaced apart from each other in the emission area EMA.

In an embodiment, the first and second electrodes ELT1 and ELT2 that are respectively disposed over the first and second partition walls PW1 and PW2 may have shapes corresponding to the respective shapes of the first and second partition walls PW1 and PW2. For example, the first and second electrodes ELT1 and ELT2 may have inclined surfaces or curved surfaces corresponding to those of the first and second partition walls PW1 and PW2, respectively, and protrude in a height direction (or a thickness direction) of the display element layer LDL.

Each of the first and second electrodes ELT1 and ELT2 may include at least one conductive material. For example, each of the first and second electrodes ELT1 and ELT2 may include at least one of metal such as Ag, Mg, Al, Pt, Pd, Au, Ni, Nd, Ir, Cr, Ti, or an alloy thereof, conductive oxide such as ITO, IZO, ZnO, or ITZO, and a conductive polymer such as poly(3,4-ethylenedioxythiophene) (PEDOT). However, the disclosure is not limited thereto.

Each of the first and second electrodes ELT1 and ELT2 may have a single-layer or multi-layer structure. For example, each of the first and second electrodes ELT1 and ELT2 may include at least one reflective electrode layer. Each of the first and second electrodes ELT1 and ELT2 may selectively further include at least one of at least one transparent electrode layer disposed on an upper portion and/or a lower portion of the reflective electrode layer, and at least one conductive capping layer covering (or overlapping) an upper portion of the reflective electrode layer and/or the transparent electrode layer.

In an embodiment, the reflective electrode layer of each of the first and second electrodes ELT1 and ELT2 may be formed of conductive material having a uniform reflectivity. For example, the reflective electrode layer may include at least one of metals such as Ag, Mg, Al, Pt, Pd, Au, Ni, Nd, Ir, Cr, and an alloy thereof. However, the disclosure is not limited thereto. In other words, reflective electrode layer may be formed of various reflective conductive materials. Each of the first and second electrodes ELT1 and ELT2 that include the reflective electrode layers may enable light emitted from the opposite ends of each of the light emitting elements LD, for example, the first and second ends EP1 and EP2, to travel in a direction (e.g., in a frontal direction) in which an image is displayed. Particularly, if the first and second electrodes ELT1 and ELT2 respectively have inclined or curved surfaces corresponding to the shapes of the first and second partition walls PW1 and PW2 and are respectively disposed to face the first and second ends EP1 and EP2 of the light emitting elements LD, light emitted from the first and second ends EP1 and EP2 of each of the light emitting elements LD may be reflected by the first and second electrodes ELT1 and ELT2 and thus more reliably travel in the frontal direction of the display panel PNL (e.g., in an upward direction of the base layer SUB1). Therefore, the efficiency of light emitted from the light emitting elements LD may be enhanced.

Furthermore, the transparent electrode layer of each of the first and second electrodes ELT1 and ELT2 may be formed of various transparent electrode materials. For example, the transparent electrode layer may include ITO, IZO, or ITZO, but the disclosure is not limited thereto. In an embodiment, each of the first and second electrodes ELT1 and ELT2 may have a triple-layer structure having a stacked structure of ITO/Ag/ITO. As such, if the first and second electrodes ELT1 and ELT2 each are formed of a multi-layer structure of double or more layers, voltage drop due to signal delay (RC delay) may be minimized. Thus, a desired voltage can be effectively transmitted to the light emitting elements LD.

If each of the first and second electrodes ELT1 and ELT2 includes the conductive capping layer covering (or overlapping) the reflective electrode layer and/or the transparent electrode layer, it is possible to prevent the reflective electrode layer or the like of the first and second electrodes ELT1 and ELT2 from being damaged by defects caused during the manufacturing process of the pixel PXL. However, the conductive capping layer may be selectively included in the first and second electrodes ELT1 and ELT2 and may be omitted according to an embodiment. Furthermore, the conductive capping layer may be considered as a component of each of the first and second electrodes ELT1 and ELT2, or considered as a separate component disposed on the first and second electrodes ELT1 and ELT2.

The first insulating layer INS1 may be disposed on an area of each of the first and second electrodes ELT1 and ELT2. For example, the first insulating layer INS1 may be formed to cover (or overlap) predetermined areas of the first and second electrodes ELT1 and ELT2 and may include an opening to expose other predetermined areas of the first and second electrodes ELT1 and ELT2.

In an embodiment, the first insulating layer INS1 may be primarily formed to cover (or overlap) the overall surfaces of the first and second electrodes ELT1 and ELT2. After the light emitting elements LD are supplied and aligned on the first insulating layer INS1, the first insulating layer INS1 may be partially open to expose the first and second electrodes ELT1 and ELT2 in the first and second contactors CNT1 and CNT2, as illustrated in FIG. 9A. As another example, the first insulating layer INS1 may be patterned in the form of an individual pattern which is sectionally disposed under the light emitting elements LD after the supply and alignment of the light emitting elements LD have been completed.

In other words, the first insulating layer INS1 may be interposed between the first and second electrodes ELT1 and ELT2 and the light emitting elements LD and may expose at least one area of each of the first and second electrodes ELT1 and ELT2. After the first and second electrodes ELT1 and ELT2 are formed, the first insulating layer INS1 may be formed to cover (or overlap) the first and second electrodes ELT1 and ELT2, so that it is possible to prevent the first and second electrodes ELT1 and ELT2 from being damaged or to prevent metal from being precipitated, in a subsequent process. Furthermore, the first insulating layer INS1 may stably support each light emitting element LD. In an embodiment, the first insulating layer INS1 may be omitted.

The light emitting elements LD may be supplied onto and aligned in the emission area EMA in which the first insulating layer INS1 is formed. For example, light emitting elements LD may be supplied to the emission area EMA by an inkjet method or the like, and the light emitting elements LD may be aligned between the first and second electrodes ELT1 and ELT2 by predetermined alignment voltages (or alignment signals) applied to the first and second electrodes ELT1 and ELT2.

A bank BNK may be disposed on the first insulating layer INS1. For example, the bank BNK may be formed between other sub-pixels to enclose the emission area EMA of the sub-pixel SPX, so that a pixel defining layer for defining the emission area EMA of the sub-pixel SPX may be formed.

In an embodiment, the bank BNK may be formed to have a second height greater than a first height of the first and second partition walls PW1 and PW2. In this case, in the step of supplying the light emitting elements LD to each emission area EMA, the bank BNK may function as a dam structure configured to prevent a solution mixed with the light emitting elements LD from being introduced into the emission area EMA of an adjacent sub-pixel SPX or control the amount of solution such that a constant amount of solution is supplied to each emission area EMA.

The bank BNK may be formed to prevent light emitted from each emission area EMA from entering an adjacent emission area EMA and causing optical interference. To this end, the bank BNK may be formed to prevent light emitted from the light emitting elements LD of each sub-pixel SPX from passing through the bank BNK.

In some embodiments, the bank BNK may not be disposed between the first and second sub-emission areas EMA_S1 and EMA_S2 (refer to FIG. 7), but the disclosure is not limited thereto.

The second insulating layer INS2 may be disposed over the light emitting elements LD aligned between the first and second electrodes ELT1 and ELT2 and may expose the first and second ends EP1 and EP2 of the light emitting elements LD. For example, the second insulating layer INS2 may be partially disposed only over predetermined areas of the light emitting elements LD without covering (or overlapping) the first and second ends EP1 and EP2 of the light emitting elements LD. The second insulating layer INS2 may be formed in an independent pattern in each emission area EMA, but the disclosure is not limited thereto. Furthermore, as illustrated in FIG. 9A, if space is present between the first insulating layer INS1 and the light emitting elements LD before the second insulating layer INS2 is formed, the space may be filled with the second insulating layer INS2. Therefore, the light emitting elements LD may be more stably supported.

The first and second contact electrodes CNE1 and CNE2 may be disposed on the first and second electrodes ELT1 and ELT2 and the first and second ends EP1 and EP2 of the light emitting elements LD. In an embodiment, the first and second contact electrodes CNE1 and CNE2 may be disposed on a same layer, as illustrated in FIG. 9A. In this case, although the first and second contact electrodes CNE1 and CNE2 are formed by a same process using a same conductive material, the disclosure is not limited thereto.

The first and second contact electrodes CNE1 and CNE2 may respectively and electrically connect the first and second ends EP1 and EP2 of the light emitting elements LD to the first and second electrodes ELT1 and ELT2.

For example, the first contact electrode CNE1 may be disposed on the first electrode ELT1 to contact the first electrode ELT1. For example, the first contact electrode CNE1 may be disposed to contact the first electrode ELT1 in a predetermined area of the first electrode ELT1 that is not covered (or overlapped) by the first insulating layer INS1. Furthermore, the first contact electrode CNE1 may be disposed on the first end EP1 of at least one light emitting element adjacent to the first electrode ELT1, e.g., on the respective first ends EP1 of light emitting elements LD, so that the first contact electrode CNE1 can contact the first ends EP1. In other words, the first contact electrode CNE1 may be disposed to cover (or overlap) the first ends EP1 of the light emitting elements LD and at least one area of the corresponding first electrode ELT1. Hence, the first ends EP1 of the light emitting elements LD may be electrically connected to the first electrode ELT1.

Likewise, the second contact electrode CNE2 may be disposed on the second electrode ELT2 to contact the second electrode ELT2. For example, the second contact electrode CNE2 may be disposed to contact the second electrode ELT2 in a predetermined area of the second electrode ELT2 that is not covered (or overlapped) by the first insulating layer INS1. Furthermore, the second contact electrode CNE2 may be disposed on the second end EP2 of at least one light emitting element LD adjacent to the second electrode ELT2, e.g., on the second ends EP2 of light emitting elements LD, so that the second contact electrode CNE2 can contact the second ends EP2. In other words, the second contact electrode CNE2 may be disposed to cover the second ends EP2 of the light emitting elements LD and at least one area of the corresponding second electrode ELT2. Hence, the second ends EP2 of the light emitting elements LD may be electrically connected to the second electrode ELT2.

The third insulating layer INS3 may be formed and/or disposed on a surface of the base layer SUB1 on which the first and second partition walls PW1 and PW2, the first and second electrodes ELT1 and ELT2, the light emitting elements LD, the first and second contact electrodes CNE1 and CNE2, and the bank BNK are formed, so that the third insulating layer INS3 may cover (or overlap) the first and second partition walls PW1 and PW2, the first and second electrodes ELT1 and ELT2, the light emitting elements LD, the first and second contact electrodes CNE1 and CNE2, and the bank BNK. The third insulating layer INS3 may include a thin-film encapsulation layer including at least one inorganic layer and/or organic layer, but the disclosure is not limited thereto. In some embodiments, at least one overcoat layer, which is not illustrated, may be further disposed over the third insulating layer INS3.

In an embodiment, each of the first to third insulating layers INS1, INS2, and INS3 may have a single-layer or multi-layer structure, and include at least one inorganic insulating material and/or organic insulating material. For example, each of the first to third insulating layers INS1, INS2, and INS3 may include various kinds of organic/inorganic insulating materials as well as SiNx, and the material of each of the first to third insulating layers INS1, INS2, and INS3 is not particularly limited. The first to third insulating layers INS1, INS2, and INS3 may include different insulating materials, or at least some of the first to third insulating layers INS1, INS2, and INS3 may include the same insulating material.

In embodiments, the first and second contact electrodes CNE1 and CNE2 may be disposed on different layers.

Figure 9C:
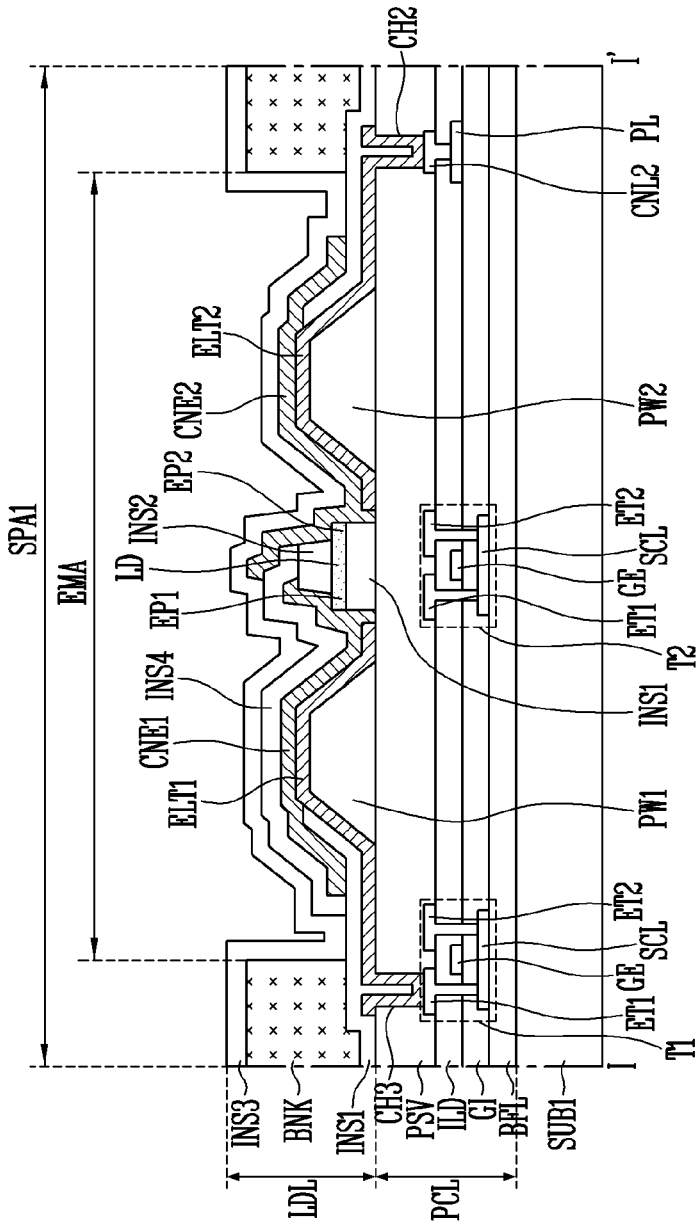

Referring to FIG. 9C, the first contact electrode CNE1 may be disposed in the sub-pixel area SPA in which the second insulating layer INS2 is disposed. In an embodiment, the first contact electrode CNE1 may be disposed on the first electrode ELT1 disposed in the corresponding sub-pixel area SPA such that the first contact electrode CNE1 contacts an area of the first electrode ELT1. Furthermore, the first contact electrode CNE1 may be disposed on the first end EP1 of at least one light emitting element LD disposed in the corresponding sub-pixel area SPA such that that the first contact electrode CNE1 contacts the first end EP1. Because of the first contact electrode CNE1, the first end EP1 of at least one light emitting element LD disposed in the sub-pixel area SPA may be electrically connected to the first electrode ELT1 disposed in the corresponding sub-pixel area SPA.

A fourth insulating layer INS4 may be disposed in the sub-pixel area SPA in which the first contact electrode CNE1 is disposed. In an embodiment, the fourth insulating layer INS4 may cover (or overlap) the second insulating layer INS2 and the first contact electrode CNE1 that are disposed in the corresponding sub-pixel area SPA.

In an embodiment, the fourth insulating layer INS4 may have a single-layer or multi-layer structure, and include at least one inorganic insulating material and/or organic insulating material, in a manner similar to that of the first to third insulating layers INS1, INS2, and INS3. For example, the fourth insulating layer INS4 may include various kinds of organic/inorganic insulating materials as well as $SiN_x$. Furthermore, the fourth insulating layer INS4 may include insulating material different from that of the first to third insulating layers INS1, INS2, and INS3, or the fourth insulating layer INS4 and at least some of the first to third insulating layers INS1, INS2, and INS3 may include the same insulating material.

The second contact electrode CNE2 may be disposed in each sub-pixel area SPA in which the fourth insulating layer INS4 is disposed. In an embodiment, the second contact electrode CNE2 may be disposed on the second electrode ELT2 disposed in the corresponding sub-pixel area SPA such that the second contact electrode CNE2 contacts an area of the second electrode ELT2. Furthermore, the second contact electrode CNE2 may be disposed on the second end EP2 of at least one light emitting element LD disposed in the corresponding sub-pixel area SPA such that that the second contact electrode CNE2 contacts the second end EP2. The second contact electrode CNE2 may electrically connect the second end EP2 of at least one light emitting element LD disposed in each sub-pixel area SPA to the second electrode ELT2 disposed in the corresponding sub-pixel area SPA.

Figure 9D:
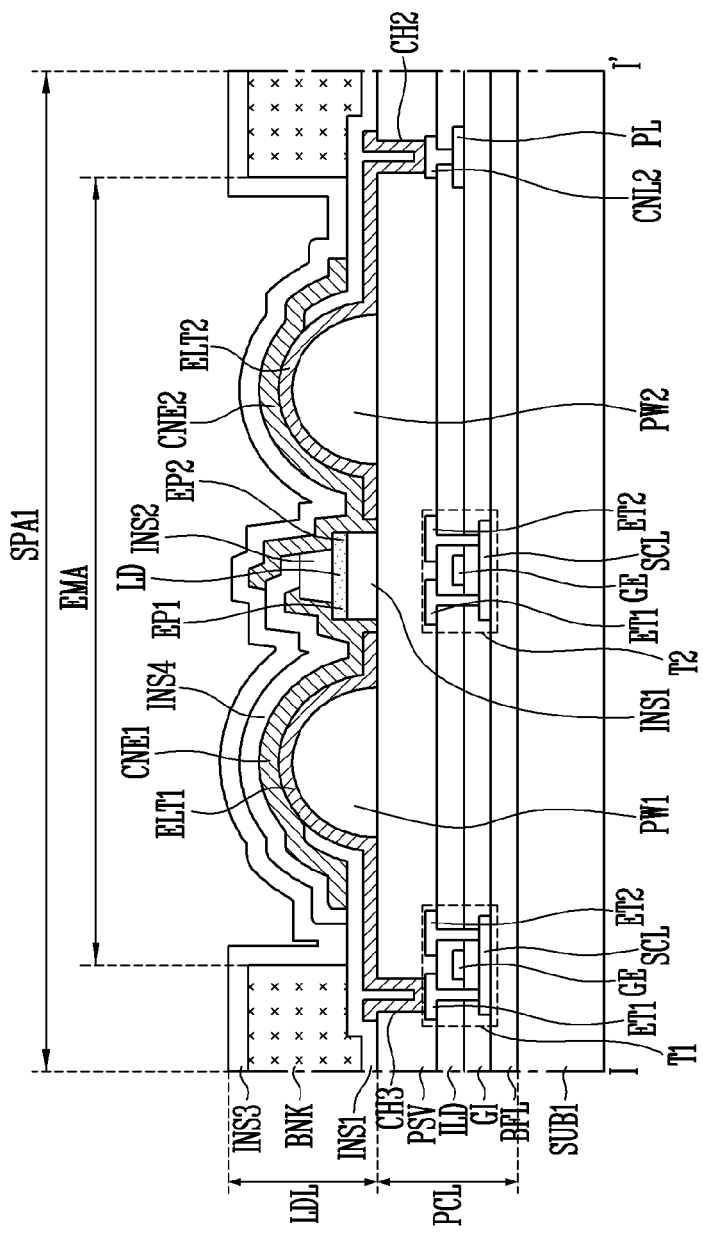

In an embodiment, each of the first and second partition walls PW1 and PW2 may have various shapes. For example, as illustrated in FIG. 9C, each of the first and second partition walls PW1 and PW2 may have a cross-sectional shape of a trapezoid, a width of which reduces from a bottom to a top thereof. As another example, as illustrated in FIG. 9D, each of the first and second partition walls PW1 and PW2 may have a semicircular or a semielliptical cross-section, a width of which reduces from a bottom to a top thereof.

Figure 10A:
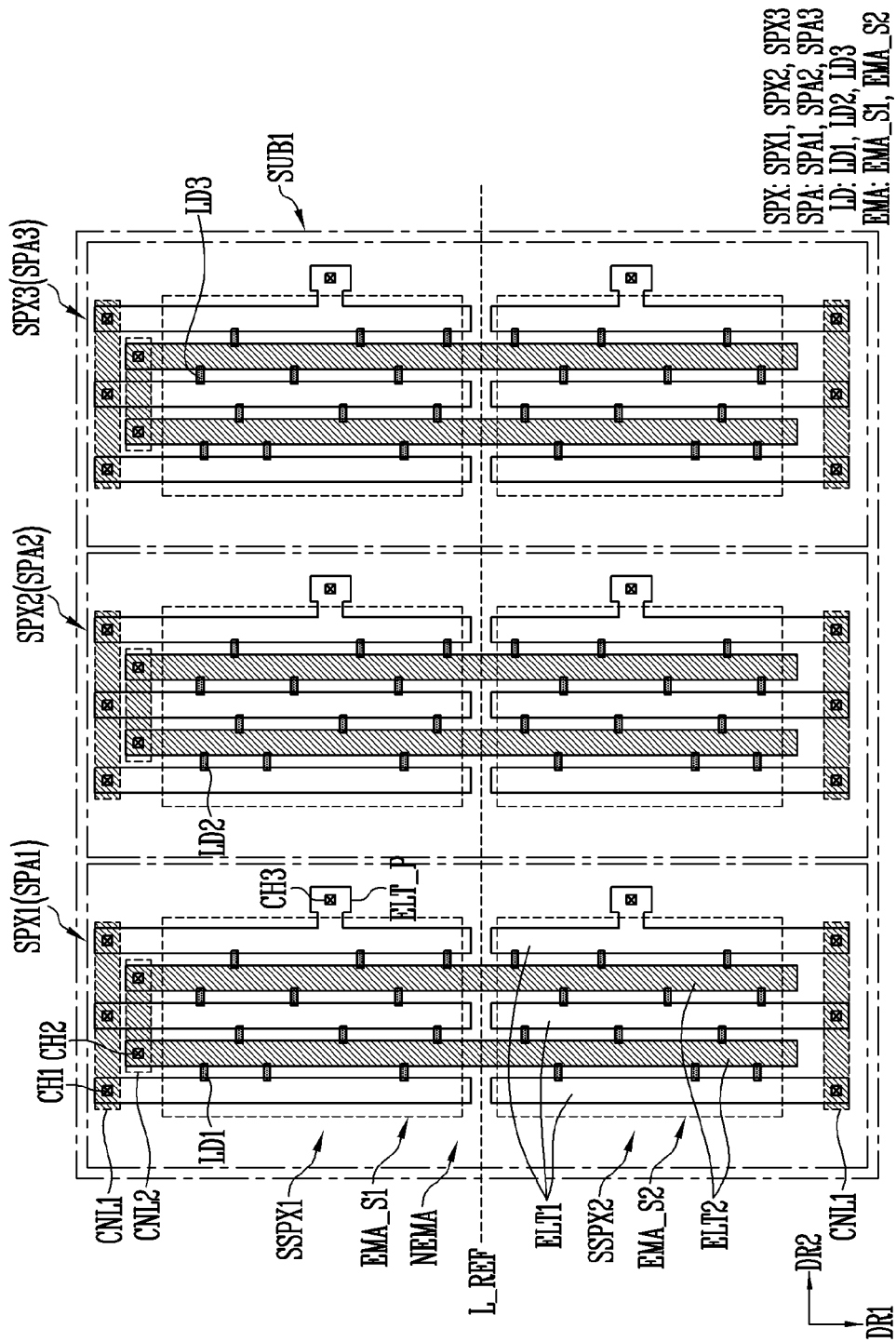

FIGS. 10A and 10B are plan views schematically illustrating other examples of a sub-pixel included in the display device of FIG. 4. In a manner similar to FIG. 7, FIGS. 10A and 10B illustrate the structure of first to third sub-pixels SPX1 to SPX3, focusing on a light source unit LSU (refer to FIGS. 6A to 6D) (or a light emitting element layer) included in the first to third sub-pixels SPX1 to SPX3. Since the first to third sub-pixels SPX1 to SPX3 are substantially equal to each other, the light source unit LSU will be described, focusing on the first sub-pixel SPX1.

Referring to FIGS. 7 and 10A, the first sub-pixel SPX1 of FIG. 10A, except the emission area EMA, may be substantially the same as the first sub-pixel SPX1 of FIG. 7. Therefore, repetitive descriptions thereof will be omitted.

As illustrated in FIG. 10A, the emission area EMA may include a first sub-emission area EMA_S1 and a second sub-emission area EMA_S2 which are spaced apart from each other in the first direction DR1 based on a reference line L_REF.

For example, the bank BNK described with reference to FIG. 9A may be disposed along the reference line L_REF between the first and second sub-emission areas EMA_S1 and EMA_S2. In other words, the bank BNK may also be disposed between the first electrodes ELT1, in a plan view.

Referring to FIGS. 7 and 10B, the first sub-pixel SPX1 of FIG. 10B, except the first electrodes ELT1, the second connection electrode CNL2, and the emission area EMA, may be substantially the same as the first sub-pixel SPX1 of FIG. 7. Therefore, repetitive descriptions thereof will be omitted.

As illustrated in FIG. 10B, the emission area EMA may include first to third sub-emission areas EMA_S1, EMA_S2, and EMA_S3 which are separated from each other in the second direction DR2 based on the second electrodes ELT2, rather than being based on the reference line L_REF. The first to third sub-emission areas EMA_S1, EMA_S2, and EMA_S3 may be adjacent to each other, and a separate bank may not be disposed therebetween.

In this case, the first electrodes ELT1 may have a length (for example, a length in the first direction DR1) similar to that of the second electrodes ELT2 and extend in the first direction DR1. Furthermore, the first electrodes ELT1 may be electrically separated or insulated from each other. In this case, each of the first electrodes ELT1 may be electrically connected, through the first contact hole CH1, to a corresponding pixel circuit (e.g., the pixel circuit PXC described with reference to FIG. 6A as a pixel circuit PXC of the first to third unit pixels SSPX1, SSPX2, and SSPX3).

In an embodiment, the second connection electrode CNL2 may extend in the second direction DR2 and also be disposed in other adjacent sub-pixels (e.g., the second and third sub-pixels SPX2 and SPX3), but the disclosure is not limited thereto.

As described with reference to FIGS. 10A and 10B, the first to third sub-emission areas EMA_S1, EMA_S2, and EMA_S3 in the emission area EMA may be set or defined in various ways.

Figure 11:
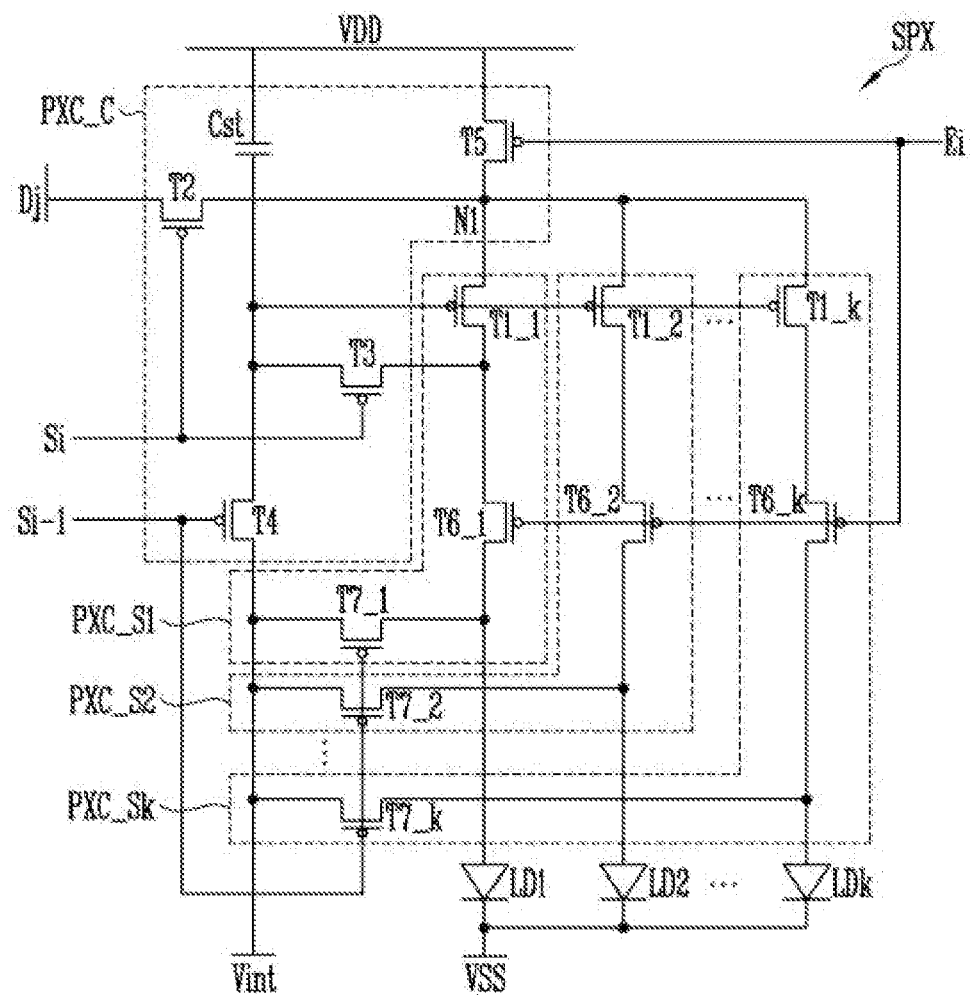
FIG. 11 is a circuit diagram schematically illustrating an example of a sub-pixel included in the pixel of FIG. 4.

FIG. 11 is a circuit diagram schematically illustrating an example of a sub-pixel included in the pixel of FIG. 4.

The first to third sub-pixels SPX1 to SPX3 shown in FIG. 4 may have a substantially identical or similar structure. A sub-pixel SPX shown in FIG. 11 may be one of the first to third sub-pixels SPX1 to SPX3 provided in the display panel PNL of FIG. 4. Therefore, as illustrated in FIG. 11, the first to third sub-pixels SPX1 to SPX3 will be collectively referred to as a sub-pixel SPX.

Referring to FIGS. 4 and 11, the sub-pixel SPX may include first to k-th light emitting elements LD1 to LDk configured to emit light having a luminance corresponding to a data signal. Furthermore, the sub-pixel SPX may include a common circuit PX_C and first to k-th sub-pixel circuits PXC_S1 to PXC_Sk configured to independently drive the respective first to k-th light emitting elements LD1 to LDk.

The common circuit PX_C of the sub-pixel SPX may store or record a data signal provided from the data line Dj in response to a scan signal provided from the scan line Si and provide the data signal to the first to k-th sub-pixel circuits PXC_S1 to PXC_Sk.

The common circuit PX_C may include second to fifth transistors T2 to T5 and a storage capacitor Cst. Since the second to fifth transistors T2 to T5 and the storage capacitor Cst are respectively substantially equal to the second to fifth transistors T2 to T5 and the storage capacitor Cst described with reference to FIG. 6C, repetitive descriptions thereof will be omitted.

The first to k-th sub-pixel circuits PXC_S1 to PXC_Sk may provide driving current, corresponding to the data signal stored in the common circuit PXC_C, to the first to k-th light emitting elements LD1 to LDk, respectively.

In an embodiment, the first to k-th sub-pixel circuits PXC_S1 to PXC_Sk may include first transistors T1_1 to T1_k, sixth transistors T6_1 to T6_k and seventh transistors T7_1 to T7_k, which correspond to the first transistor T1, the sixth transistor T6, and the seventh transistor T7 that are described with reference to FIG. 6A.

For example, the first sub-pixel circuit PXC_S1 may include a first transistor T1_1, a sixth transistor T6_1, and a seventh transistor T7_1, and provide first driving current corresponding to a data signal to the first light emitting element LD1. Here, the first transistor T1_1, the sixth transistor T6_1, and the seventh transistor T7_1 may be respectively substantially identical with the first transistor T1, the sixth transistor T6, and the seventh transistor T7 that are described with reference to FIG. 6A, so that repetitive descriptions thereof will be omitted. Likewise, the second sub-pixel circuit PXC_S2 may include a first transistor T1_2, a sixth transistor T6_2, and a seventh transistor T7_2 and provide second driving current, corresponding to a data signal, to the second light emitting element LD2. The k-th sub-pixel circuit PXC_Sk may include a first transistor T1_k, a sixth transistor T6_k, and a seventh transistor T7_k and provide k-th driving current, corresponding to a data signal, to the k-th light emitting element LDk.

In other words, the first to k-th sub-pixel circuits PXC_S1 to PXC_Sk may have the same circuit structure and respectively and independently provide driving currents, corresponding to a data signal stored in the common circuit PXC_C, to the first to k-th light emitting elements LD1 to LDk. For example, in the third period P3 described with reference to FIG. 6E, total driving current may be provided from the first power supply VDD to a first node N1 through the fifth transistor T5. Thereafter, in the first node N1, the total driving current may be distributed to the first to k-th sub-pixel circuits PXC_S1 to PXC_Sk, and the distributed driving currents may be respectively provided to the first to k-th light emitting elements LD1 to LDk. Since driving current that flows through each of the first to k-th light emitting elements LD1 to LDk is controlled by the respective first transistors T1_1 to T1_k of each of the first to k-th sub-pixel circuits PXC_S1 to PXC_Sk regardless of characteristics of each of the first to k-th light emitting elements LD1 to LDk, uniform driving current may be provided to each of the first to k-th light emitting elements LD1 to LDk.

In other words, the driving currents are independently provided to the first to k-th light emitting elements LD1 to LDk. Therefore, even in case that the first to k-th light emitting elements LD1 to LDk have a characteristic deviation (e.g., a forward voltage drop (Vf) deviation), identical or similar driving currents may be respectively provided to the first to k-th light emitting elements LD1 to LDk. Therefore, the first to k-th light emitting elements LD1 to LDk may uniformly emit light.

Although FIG. 11 illustrates that the first to k-th sub-pixel circuits PXC_S1 to PXC_Sk are respectively electrically connected to the first to k-th light emitting elements LD1 to LDk, this is only an example for describing an embodiment where the first to k-th light emitting elements LD1 to LDk can emit light independently from each other, and the sub-pixel SPX is not limited thereto. For example, each of the first to k-th sub-pixel circuits PXC_S1 to PXC_Sk may be electrically connected to light emitting elements (e.g., the light source unit LSU described with reference to FIGS. 6A to 6D) which are electrically connected in serial/parallel to each other.

Furthermore, although FIG. 11 illustrates that the sub-pixel SPX include the common circuit PX_C and the first to k-th sub-pixel circuits PXC_S1 to PXC_Sk, the sub-pixel SPX is not limited thereto. For example, the common circuit PX_C and the first sub-pixel circuit PXC_S1 may form a pixel circuit (e.g., the pixel circuit PXC described with reference to FIG. 6C) and provide first driving current to the first light emitting element LD1. Each of the second to k-th sub-pixel circuits PXC_S2 to PXC_Sk may mirror the first driving current and provide the mirrored current to each of the second to k-th light emitting elements LD2 to LDk.

Figure 12:
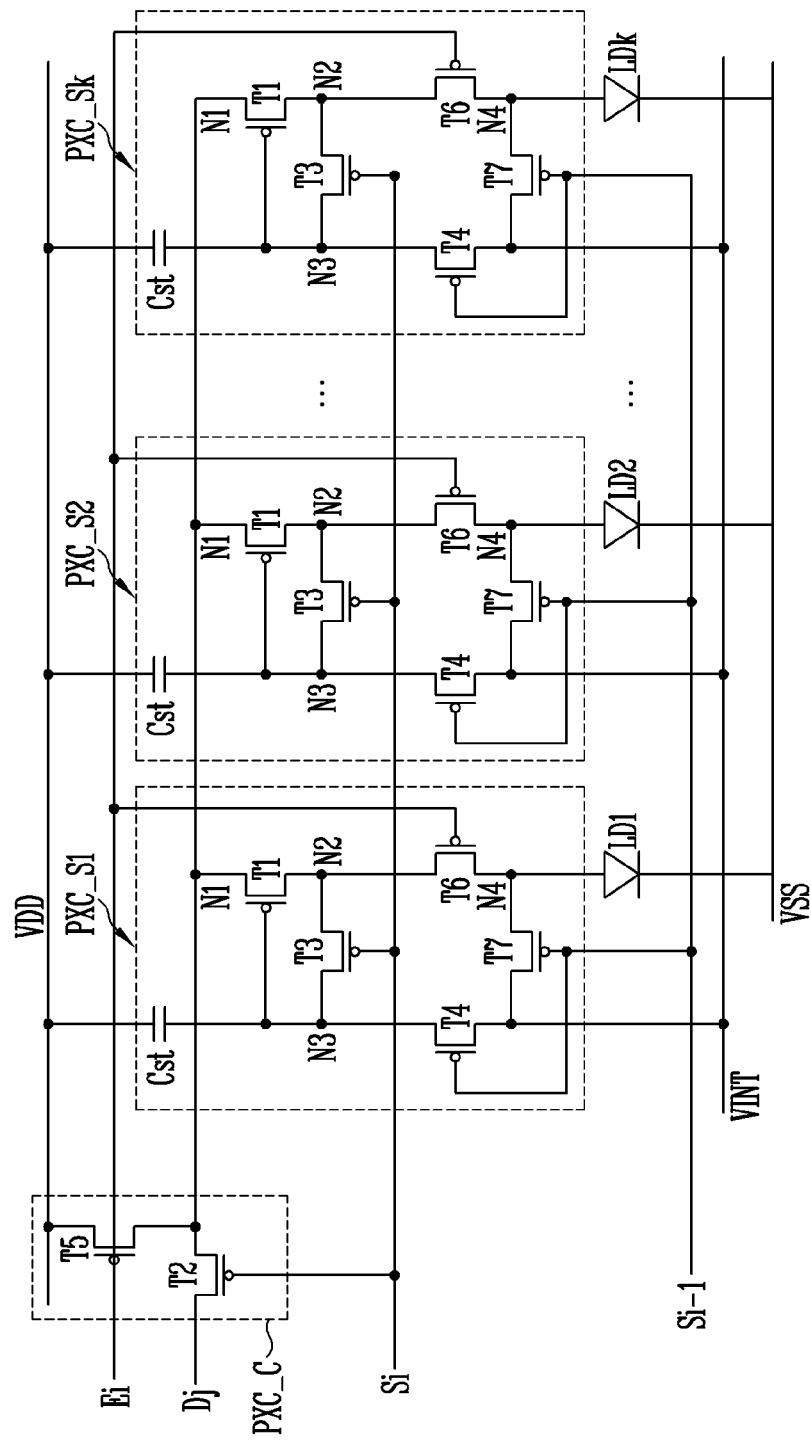
FIG. 12 is a circuit diagram schematically illustrating an example of a sub-pixel included in the pixel of FIG. 4.

FIG. 12 is a circuit diagram schematically illustrating an example of a sub-pixel included in the pixel of FIG. 4.

Referring to FIGS. 4 and 12, a common circuit PX_C shown in FIG. 12 is different from the common circuit PXC_C shown in FIG. 11 at least in that the common circuit PXC_C of FIG. 12 includes only the second and fifth transistors T2 and T5. Furthermore, first to k-th sub-pixel circuits PXC_S1 to PXC_Sk shown in FIG. 12 are different from those of FIG. 11 at least in that each of the first to k-th sub-pixel circuits PXC_S1 to PXC_Sk of FIG. 12 includes third and fourth transistors T3 and T4 and a storage capacitor Cst.

The first transistors T1 for the first to k-th sub-pixel circuits PXC_S1 to PXC_Sk may have a characteristic deviation (e.g., a threshold voltage deviation). Therefore, some of driving currents generated from the first to k-th sub-pixel circuits PXC_S1 to PXC_Sk in response to a data signal VDATA (e.g., the data signal stored in the storage capacitor Cst shown in FIG. 11) may have a deviation.

Hence, each of the first to k-th sub-pixel circuits PXC_S1 to PXC_Sk illustrated in FIG. 12 may store, in the storage capacitor Cst, a data signal that reflects characteristics of the corresponding first transistor T1, and provide driving current corresponding to the associated data signal to the corresponding light emitting element (for example, the corresponding light emitting element of the first to k-th light emitting elements LD1 to LDk). Therefore, the first to k-th light emitting elements LD1 to LDk may more uniformly emit light.

Figure 13:
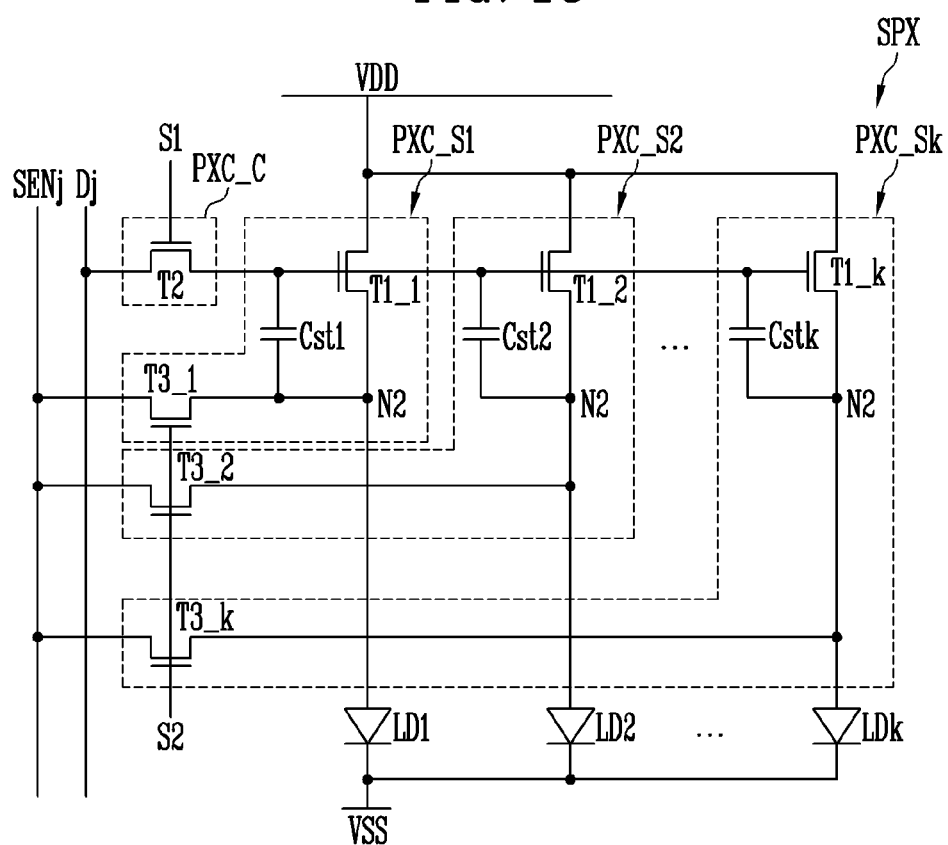
FIG. 13 is a circuit diagram schematically illustrating an example of a sub-pixel included in the pixel of FIG. 4.

FIG. 13 is a circuit diagram schematically illustrating an example of a sub-pixel included in the pixel of FIG. 4.

Referring to FIG. 13, the sub-pixel SPX may include first to k-th light emitting elements LD1 to LDk configured to emit light having a luminance corresponding to a data signal. Furthermore, the sub-pixel SPX may include a common circuit PX_C and first to k-th sub-pixel circuits PXC_S1 to PXC_Sk configured to independently drive the respective first to k-th light emitting elements LD1 to LDk.

The common circuit PX_C of the sub-pixel SPX may provide, to the first to k-th sub-pixel circuits PXC_S1 to PXC_Sk, a data signal provided from the data line Dj in response to a scan signal provided from the first scan line S1.

The common circuit PX_C may include a second transistor T2. The second transistor T2 is substantially identical with the second transistor T2 described with reference to FIG. 6D, so that repetitive descriptions thereof will be omitted.

Each of the first to k-th sub-pixel circuits PXC_S1 to PXC_Sk may store a data signal provided from the common circuit PX_C and provide driving current corresponding to the stored data signal to the corresponding light emitting element (for example, one of the first to k-th light emitting elements LD1 to LDk).

In an embodiment, the first to k-th sub-pixel circuits PXC_S1 to PXC_Sk may include first transistors T1_1 to T1_k, third transistors T3_1 to T3_k and storage capacitors Cst_1 to Cst_k, which correspond to the first transistor T1, the third transistor T3, and the storage capacitor Cst that are described with reference to FIG. 6D.

For example, the first sub-pixel circuit PXC_S1 may include a first transistor T1_1, a third transistor T3_1, and a first storage capacitor Cst1 and provide first driving current, corresponding to a data signal, to the first light emitting element LD1. Here, the first transistor T1_1, the third transistor T3_1, and the first storage capacitor Cst1 may be respectively substantially identical with the first transistor T1, the third transistor T3, and the storage capacitor Cst that are described with reference to FIG. 6A, so that repetitive descriptions thereof will be omitted. Likewise, the second sub-pixel circuit PXC_S2 may include a first transistor T1_2, a third transistor T3_2, and a second storage capacitor Cst2 and provide second driving current, corresponding to a data signal, to the second light emitting element LD2. The k-th sub-pixel circuit PXC_Sk may include a first transistor T1_k, a third transistor T3_k, and a k-th storage capacitor Cstk and provide k-th driving current, corresponding to a data signal, to the k-th light emitting element LDk.

In other words, each of the first to k-th sub-pixel circuits PXC_S1 to PXC_Sk illustrated in FIG. 13 may store a data signal in the first to k-th storage capacitors Cst1 to Cstk and provide driving current corresponding to the associated data signal to the corresponding light emitting element (for example, the corresponding light emitting element of the first to k-th light emitting elements LD1 to LDk). Therefore, the first to k-th light emitting elements LD1 to LDk may more uniformly emit light.

Figure 14:
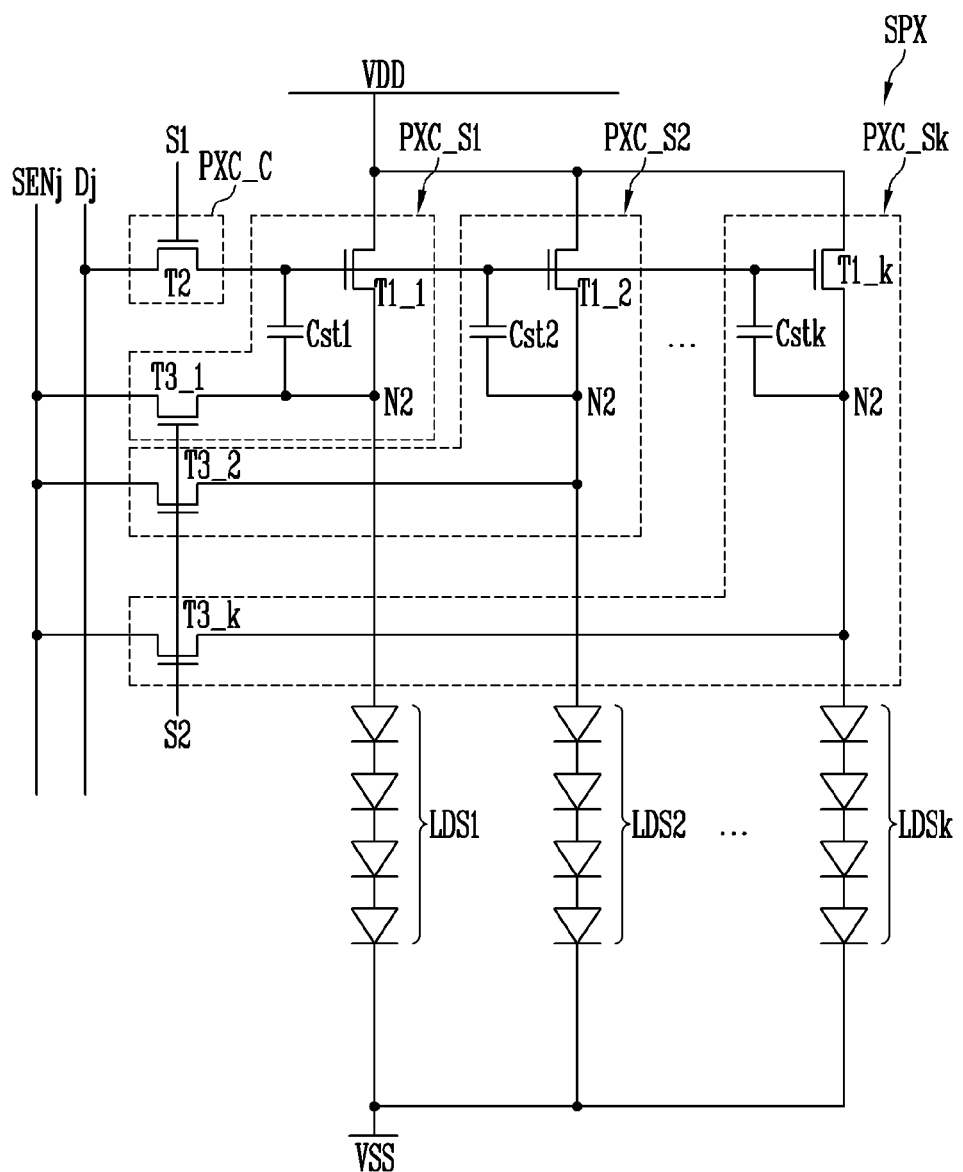
FIG. 14 is a circuit diagram schematically illustrating an example of a sub-pixel included in the pixel of FIG. 4.
Figure 15:
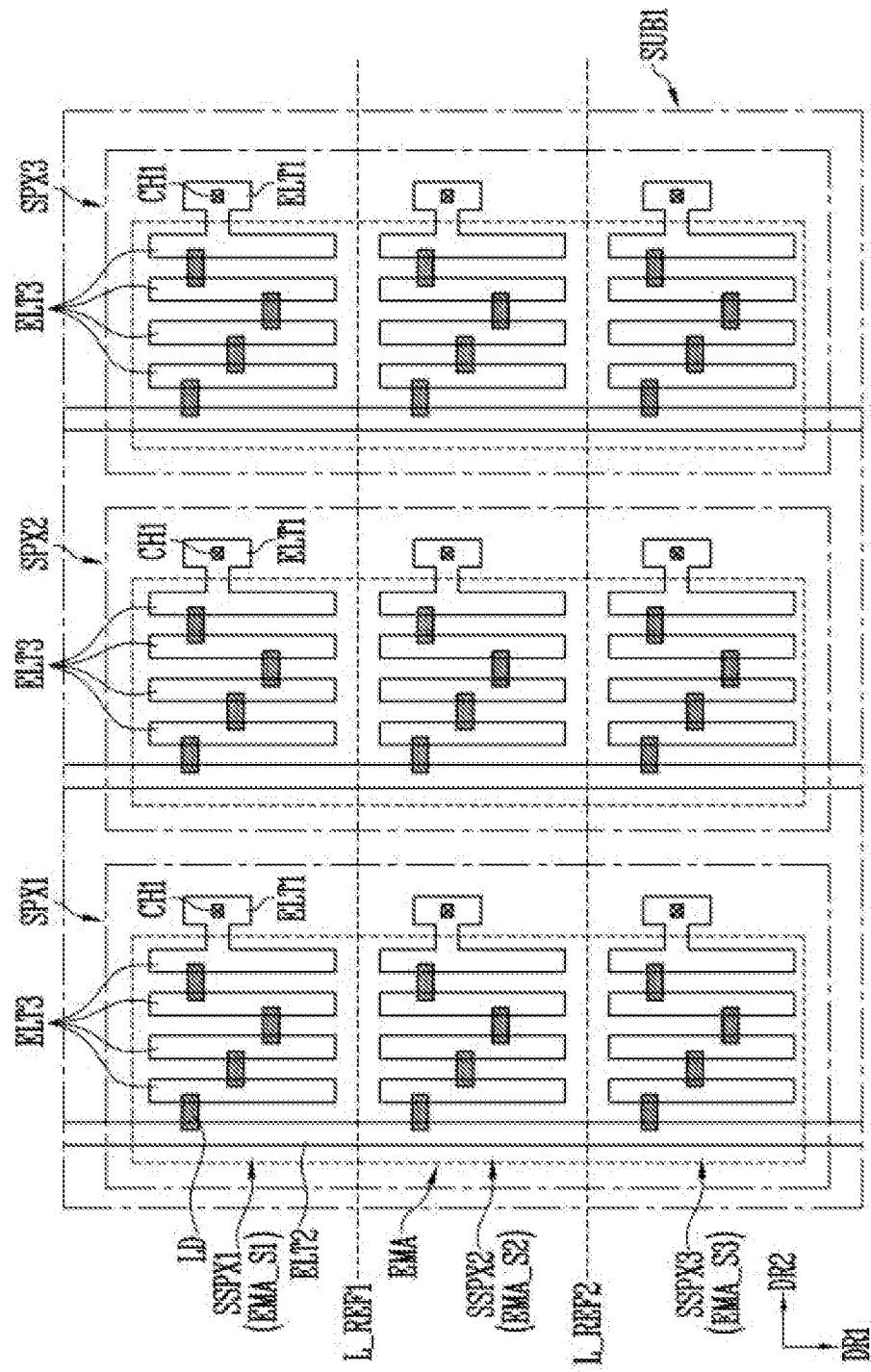
FIG. 15 is a plan view schematically illustrating an example of a sub-pixel of FIG. 14.

FIG. 14 is a circuit diagram schematically illustrating an example of a sub-pixel included in the pixel of FIG. 4. FIG. 15 is a plan view schematically illustrating an example of a sub-pixel of FIG. 14.

Referring to FIGS. 13 and 14, the sub-pixel SPX of FIG. 14 is different from the sub-pixel SPX of FIG. 13 at least in that first to k-th sub-pixel circuits PXC_S1 to PXC_Sk are respectively connected to first to k-th light emitting element strings LDS1 to LDSk (or light source units) including light emitting elements electrically connected in series to each other. The sub-pixel SPX of FIG. 14, except the first to k-th light emitting element strings LDS1 to LDSk, is substantially identical or similar to the sub-pixel SPX of FIG. 13, so that repetitive descriptions thereof will be omitted.

The first sub-pixel circuit PXC_S1 may provide, to the first light emitting element string LDS1 (or a first sub-light source unit), first driving current corresponding to a data signal provided from the common circuit PXC_C. Likewise, the second sub-pixel circuit PXC_S2 may provide, to a second light emitting element string LDS2, second driving current corresponding to a data signal provided from the common circuit PXC_C. The k-th sub-pixel circuit PXC_Sk may provide, to a k-th light emitting element string LDSk, k-th driving current corresponding to a data signal provided from the common circuit PXC_C.

Referring to FIG. 15, there is illustrated in FIG. 15 structures of the first to third sub-pixels SPX1 to SPX3, focusing on the first to k-th light emitting element strings LDS1 to LDSk (or a light emitting element layer) included in the sub-pixel SPX of FIG. 14. For the sake of explanation, FIG. 15 illustrates that the sub-pixel SPX includes three light emitting element strings (for example, first to k-th light emitting element strings, where k is equal to 3), and each of the light emitting element strings includes fourth light emitting elements LD electrically connected in series to each other.

Referring to FIG. 15, the emission area EMA may be divided into first to third sub-emission areas EMA_S1, EMA_S2, and EMA_S3 by first and second reference lines L_REF1 and L_REF2. The arrangement of the light emitting elements LD in the first to third sub-emission areas EMA_S1, EMA_S2, and EMA_S3 are substantially identical or similar to each other, so that the arrangement of the light emitting elements LD will be described, focusing on the first sub-emission area EMA_S1.

The first sub-pixel SPX1 (or the first unit pixel SSPX1 corresponding to the first sub-emission area EMA_S1) may include a first electrode ELT1 and a second electrode ELT2 disposed in the emission area EMA (or the sub-pixel area) at positions spaced apart from each other, and third electrodes ELT3 arranged between the first electrode ELT1 and the second electrode ELT2. Furthermore, the first-sub pixel SPX1 (or the first unit pixel SSPX1) may include light emitting elements LD electrically connected in series between the first and second electrodes ELT1 and ELT2 through the third electrodes ELT3.

In an embodiment, the first electrode ELT1 and the second electrode ELT2 may be disposed at positions spaced apart from each other in the emission area EMA (or the sub-pixel area) such that at least predetermined areas thereof face each other. For example, the first and second electrodes ELT1 and ELT2 each may extend in the first direction DR1 and may be spaced apart from each other by a predetermined distance in the second direction DR2 that is substantially perpendicular to or intersects the first direction DR1. However, the disclosure is not limited thereto. For example, the shapes and/or mutual arrangement relationship of the first and second electrodes ELT1 and ELT2 may be changed in various ways.

The third electrodes ELT3 may extend in the first direction DR1 and be disposed at regular intervals in the second direction DR2 between the first and second electrodes ELT1 and ELT2. For example, as illustrated in FIG. 15, four third electrodes ELT3 may be disposed at regular intervals in the second direction DR2 between the first and second electrodes ELT1 and ELT2, but the disclosure is not limited thereto. The number of third electrodes ELT3 may be changed in various ways.

In embodiments, the first electrode ELT1 may be disposed in each of the first to third sub-emission areas EMA_S1, EMA_S2, and EMA_S3. The second electrode ELT2 may be disposed in the entirety of the emission area EMA, for example, across the sub-emission areas. The third electrode ELT3 may be disposed between the first and second electrodes ELT1 and ELT2 in the corresponding sub-emission area (e.g., in the first sub-emission area EMA_S1).

In embodiments, the first electrode ELT1 may be integral with a third electrode ELT3.

Each of the first to third electrodes ELT1, ELT2, and ELT3 may have a single layer structure or a multi-layer structure, as described with reference to FIG. 7. Furthermore, each of the first to third electrodes ELT1, ELT2, and ELT3 may protrude in an upward direction (or a height direction or a thickness direction of the base layer SUB1) by a partition wall that is disposed to overlap the corresponding electrode.

The light emitting elements LD each may be disposed between two adjacent electrodes of the first to third electrodes ELT1 to ELT3 and be electrically connected to the two adjacent electrodes. For example, a light emitting element LD may be disposed between the first electrode ELT1 and a first sub-electrode (for example, a third electrode ELT3 closest to the first electrode ELT1 among the third electrodes ELT3). The first end of the light emitting element LD may be electrically connected to the first electrode ELT1, and the second end of the light emitting element LD may be electrically connected to the first sub-electrode. Likewise, a light emitting element LD may be disposed between the second electrode ELT2 and the second sub-electrode (for example, a third electrode ELT3 closest to the second electrode ELT2 among the third electrodes ELT3). The first end of the light emitting element LD may be electrically connected to the second sub-electrode, and the second end of the light emitting element LD may be electrically connected to the second electrode ELT2. In this way, the light emitting elements LD in the first sub-emission area EMA_S1 may be electrically connected in series between the first and second electrodes ELT1 and ELT2.

Although FIG. 15 illustrates that the light emitting elements LD are electrically connected in series in a sub-emission area (e.g., the first sub-emission area EMA_S1), the light emitting elements LD are not limited thereto. For example, in the sub-emission area, at least some of the light emitting elements LD may be electrically connected in parallel to other light emitting elements LD. In other words, as illustrated in FIG. 15, the light emitting elements LD in the sub-emission area may be arranged in a serial/parallel combined connection structure.

Furthermore, although the light emitting elements LD shown in FIG. 15 have been described as being applied to the sub-pixel SPX of FIG. 14, the disclosure is not limited thereto. For example, the light emitting elements LD (or the connection structure of the light emitting elements LD) shown in FIG. 15 may be applied to the sub-pixel SPX of FIG. 11, the sub-pixel SPX of FIG. 12, etc.

While the spirit and scope of the disclosure are described by detailed embodiments, it should be noted that the above-described embodiments are merely descriptive and should not be considered limiting. It should be understood by those skilled in the art that various changes, substitutions, and alternations may be made herein without departing from the scope of the disclosure.

The scope of the claimed invention is not limited by detailed descriptions of the specification, and should be defined by the accompanying claims. Furthermore, all changes or modifications of the disclosure derived from the meanings and scope of the claims, and equivalents thereof should be construed as being included in the scope of the disclosure.

What is claimed is:

1. A display device comprising:
   a first power line that transmits first power signal;
   a second power line that transmits a second power signal;
   one data line that transmits a data signal;
   one scan line that transmits a scan signal; and
   at least two pixels electrically connected to the first power line, the second power line, the one data line, and the one scan line, wherein
   each of the at least two pixels comprises:
   light emitting elements electrically connected between the first power line and the second power line; and
   a first transistor that provides driving current to the light emitting elements in response to the data signal.

2. The display device according to claim 1, wherein each of the light emitting elements comprises a rod-shaped light emitting diode having a size in a range of a nanometer scale to a micrometer scale.

3. The display device according to claim 1, wherein the at least two pixels are disposed in a pixel area defined by the one data line, an adjacent data line adjacent to the one data line, the one scan line, and an adjacent scan line adjacent to the one scan line.

4. The display device according to claim 1, wherein each of the at least two pixels comprises a second transistor connected between the one data line and the first transistor, and transmits the data signal to the first transistor in response to the scan signal.

5. The display device according to claim 4, wherein each of the at least two pixels comprises a capacitor connected between a gate electrode of the first transistor and the first power line.

6. The display device according to claim 1, further comprising a common circuit connected between the one data line and the at least two pixels,
   wherein the common circuit comprises a second transistor that transmits the data signal to the first transistor of each of the at least two pixels in response to the scan signal.

7. The display device according to claim 6, further comprising a third power line that transmits a third power signal,
   wherein the common circuit comprises:
   a capacitor connected between a gate electrode of the first transistor of each of the at least two pixels and the first power line; and
   a third transistor connected to the third power line and an electrode of the capacitor.

8. The display device according to claim 7, wherein each of the at least two pixels comprises a fourth transistor connected between anode electrodes of the light emitting elements and the third power line.

9. The display device according to claim 6, wherein each of the at least two pixels comprises a capacitor connected to a gate electrode of the first transistor and an electrode of the first transistor.

10. The display device according to claim 9, further comprising a third power line that transmits a third power signal,
    wherein each of the at least two pixels comprises:
    a third transistor connected to the third power line and an electrode of the capacitor; and
    a fourth transistor connected between anode electrodes of the light emitting elements and the third power line.

11. The display device according to claim 9, further comprising a sensing line,
    wherein each of the at least two pixels comprises a fifth transistor connected between anode electrodes of the light emitting elements and the sensing line.

12. The display device according to claim 1, wherein at least some of the light emitting elements included in each of the at least two pixels are connected in series between the first power line and the second power line.

13. A display device comprising:
    a first power line that transmits first power signal;
    a second power line that transmits a second power signal;
    one data line that transmits a data signal;
    one scan line that transmits a scan signal; and
    a pixel electrically connected to the first power line, the second power line, the one data line, and the one scan line, wherein
    the pixel comprises:
    at least two light source units electrically connected between the first power line and the second power line, each of the at least two light source units comprising at least two light emitting elements; and
    at least two pixel circuits that independently provide, to each of the at least two light source units, driving current corresponding to the data signal provided in response to the scan signal.

14. The display device according to claim 13, wherein each of the at least two pixel circuits comprises a first transistor that provides driving current to the at least two light emitting elements in response to the data signal.

15. The display device according to claim 14, wherein the pixel further comprises a common circuit connected to the one data line, the one scan line, and the at least two pixel circuits, and the common circuit comprises a second transistor that transmits the data signal to the first transistor of each of the at least two pixel circuits in response to the scan signal.

16. A display device comprising:
    a substrate including an emission area;
    a first electrode disposed on the emission area of the substrate;
    second electrodes disposed on the emission area of the substrate, facing the first electrode, and spaced apart from each other and electrically disconnected from each other;
    first light emitting elements disposed between a first sub-electrode of the second electrodes and the first electrode;
    second light emitting elements disposed between a second sub-electrode of the second electrodes and the first electrode; and
    a bank disposed on the substrate along a perimeter of the emission area,
    wherein the bank is not disposed between the second electrodes in the emission area.

17. The display device according to claim 16, wherein the first electrode extends in a first direction, and
    the second electrodes extend in the first direction and are spaced apart from each other in the first direction.

18. The display device according to claim 16, wherein the first electrode extends in a first direction, and
    the second electrodes extend in the first direction and are spaced apart from each other in a second direction perpendicular to the first direction.

19. The display device according to claim 16, further comprising a third electrode disposed between the first sub-electrode and the first electrode, and spaced apart from the first sub-electrode and the first electrode,
    wherein the first light emitting elements each are disposed between two adjacent electrodes among the first sub-electrode, the first electrode, and the third electrode.

* * * * *